US012764932B2

(12) United States Patent
Lim et al.

(10) Patent No.: US 12,764,932 B2
(45) Date of Patent: Oct. 13, 2026

(54) SEMICONDUCTOR DEVICE

(71) Applicant: SAMSUNG ELECTRONICS CO., LTD., Suwon-si (KR)

(72) Inventors: Yirang Lim, Suwon-si (KR); Jinsu Lee, Suwon-si (KR); Jungwoo Kang, Suwon-si (KR); Junrak Choi, Suwon-si (KR); Yaejin Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 413 days.

(21) Appl. No.: 18/494,449

(22) Filed: Oct. 25, 2023

(65) Prior Publication Data

US 2024/0244825 A1 Jul. 18, 2024

(30) Foreign Application Priority Data

Jan. 18, 2023 (KR) ........................ 10-2023-0007486

(51) Int. Cl.
*H10B 12/00* (2023.01)

(52) U.S. Cl.
CPC ......... *H10B 12/315* (2023.02); *H10B 12/033* (2023.02)

(58) Field of Classification Search
None
See application file for complete search history.

(56) References Cited

U.S. PATENT DOCUMENTS 7,709,342 B2 5/2010 Kim et al.
9,093,460 B2 7/2015 Kim et al.
9,520,460 B2 12/2016 Lee et al.
9,543,152 B2 1/2017 Huang et al.
9,577,028 B2 2/2017 Lim et al.
2015/0270271 A1* 9/2015 Sakamoto .............. H10D 1/042 257/306
2020/0312949 A1 10/2020 Haratipour et al.
2021/0159310 A1 5/2021 Lee et al.
2024/0006472 A1* 1/2024 Leng ...................... H10D 1/716

FOREIGN PATENT DOCUMENTS

KR 10-0312262 11/2001
KR 10-0315013 4/2002
KR 10-0717810 5/2007

OTHER PUBLICATIONS

Extended European Search Report dated May 24, 2024 in corresponding Appln. No. EP 23213918.8.

* cited by examiner

*Primary Examiner* — Jay C Chang
(74) *Attorney, Agent, or Firm* — Morgan, Lewis & Bockius LLP

(57) ABSTRACT

A semiconductor device includes a conductive pattern, and a capacitor electrically connected to the conductive pattern. The capacitor includes a first electrode structure electrically connected to the conductive pattern, a dielectric layer disposed on the first electrode structure, a second electrode structure disposed on the dielectric layer, and a plate electrode disposed on the second electrode structure. The second electrode structure includes a first electrode material layer including a first metal element and a nitrogen element, and a first protective material layer including a second metal element, a Group 14 element, and an oxygen element.

20 Claims, 22 Drawing Sheets

SEMICONDUCTOR DEVICE

CROSS-REFERENCE TO RELATED APPLICATION(S)

This U.S. patent application claims priority under 35 USC § 119 to Korean Patent Application No. 10-2023-0007486 filed on Jan. 18, 2023 in the Korean Intellectual Property Office, the disclosure of which is incorporated by reference in its entirety herein.

1. Technical Field

The present inventive concept relates to a semiconductor device.

2. Discussion of Related Art

Semiconductor memory is a digital electronic semiconductor device for digital data storage. Semiconductor memory may refer to devices in which data is stored within metal-oxide-semiconductor (MOS) memory cells on a silicon integrated circuit. An example of semiconductor memory includes a dynamic-random-access memory (DRAM), which uses a transistor and a capacitor per cell.

In accordance with the demand for a high degree of integration and miniaturization of semiconductor memory, the capacitor of the semiconductor memory also has a reduced size. However, oxidation may form an oxidation layer on an upper electrode or a dielectric layer of the capacitor. As a result, the upper electrode and the dielectric layer may have degraded crystallinity and the upper electrode may have increased sheet resistance, thereby reducing electrical properties and reliability of the semiconductor memory.

SUMMARY

An aspect of the present inventive concept provides a semiconductor device having increased electrical properties and reliability.

According to an aspect of the present inventive concept, there is provided a semiconductor device including a conductive pattern, and a capacitor electrically connected to the conductive pattern. The capacitor includes a first electrode structure electrically connected to the conductive pattern, a dielectric layer disposed on the first electrode structure, a second electrode structure disposed on the dielectric layer, and a plate electrode disposed on the second electrode structure. The second electrode structure includes a first electrode material layer including a first metal element and a nitrogen element, and a first protective material layer including a second metal element, a Group 14 element, and an oxygen element.

According to an aspect of the present inventive concept, there is provided a semiconductor device including a conductive pattern, and a capacitor electrically connected to the conductive pattern. The capacitor include a first electrode structure electrically connected to the conductive region, a dielectric layer disposed on the first electrode structure, a second electrode structure disposed on the dielectric layer, and a plate electrode disposed on the second electrode structure. The second electrode structure includes at one electrode material layer and at least one protective material layer. A thickness of the at least one electrode material layer is greater than a thickness of the at least one protective material layer. The at least one electrode material layer and the at least one protective material layer include a same metal element. The at least one electrode material layer further includes a nitrogen element. The at least one protective material layer further includes a silicon element and an oxygen element.

According to another aspect of the present inventive concept, there is provided a semiconductor device including a conductive pattern, and a capacitor electrically connected to the conductive pattern. The capacitor includes a first electrode structure electrically connected to the conductive pattern, a dielectric layer disposed on the first electrode structure, a second electrode structure disposed on the dielectric layer, and a plate electrode disposed on the second electrode structure. The second electrode structure includes at one electrode material layer and at least one protective material layer. The first electrode structure has a pillar shape extending in a direction, perpendicular to an upper surface of the structure. The dielectric layer is disposed adjacent an upper surface of the first electrode structure, and is disposed between the first electrode structure and the second electrode structure. A thickness of the at least one electrode material layer is greater than a thickness of the at least one protective material layer. The at least one electrode material layer includes a first material. The at least one protective material layers includes at least one of a second material and a third material. The first material is a metal nitride including a metal element and a nitrogen element. The second material includes a metal element, a silicon element, and an oxygen element. The third material includes a metal element, a silicon element, an oxygen element, and a nitrogen element.

BRIEF DESCRIPTION OF DRAWINGS

The above and other aspects and features of the present inventive concept will be more clearly understood from the following detailed description, taken in conjunction with the accompanying drawings, in which.

DETAILED DESCRIPTION

Hereinafter, example embodiments of the present inventive concept will be described below, with reference to the accompanying drawings.

Figure 1:
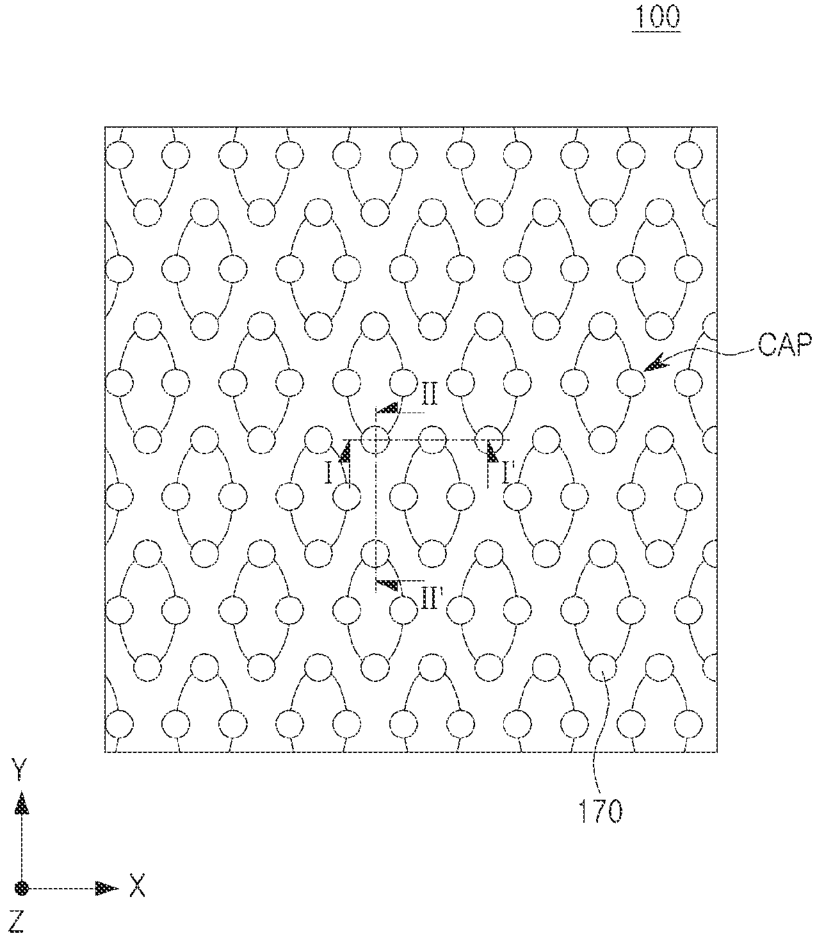
FIG. 1 is a schematic layout diagram illustrating a semiconductor device according to an example embodiment.

FIG. 1 is a schematic layout diagram illustrating a semiconductor device 100 according to an example embodiment.

Figure 2:
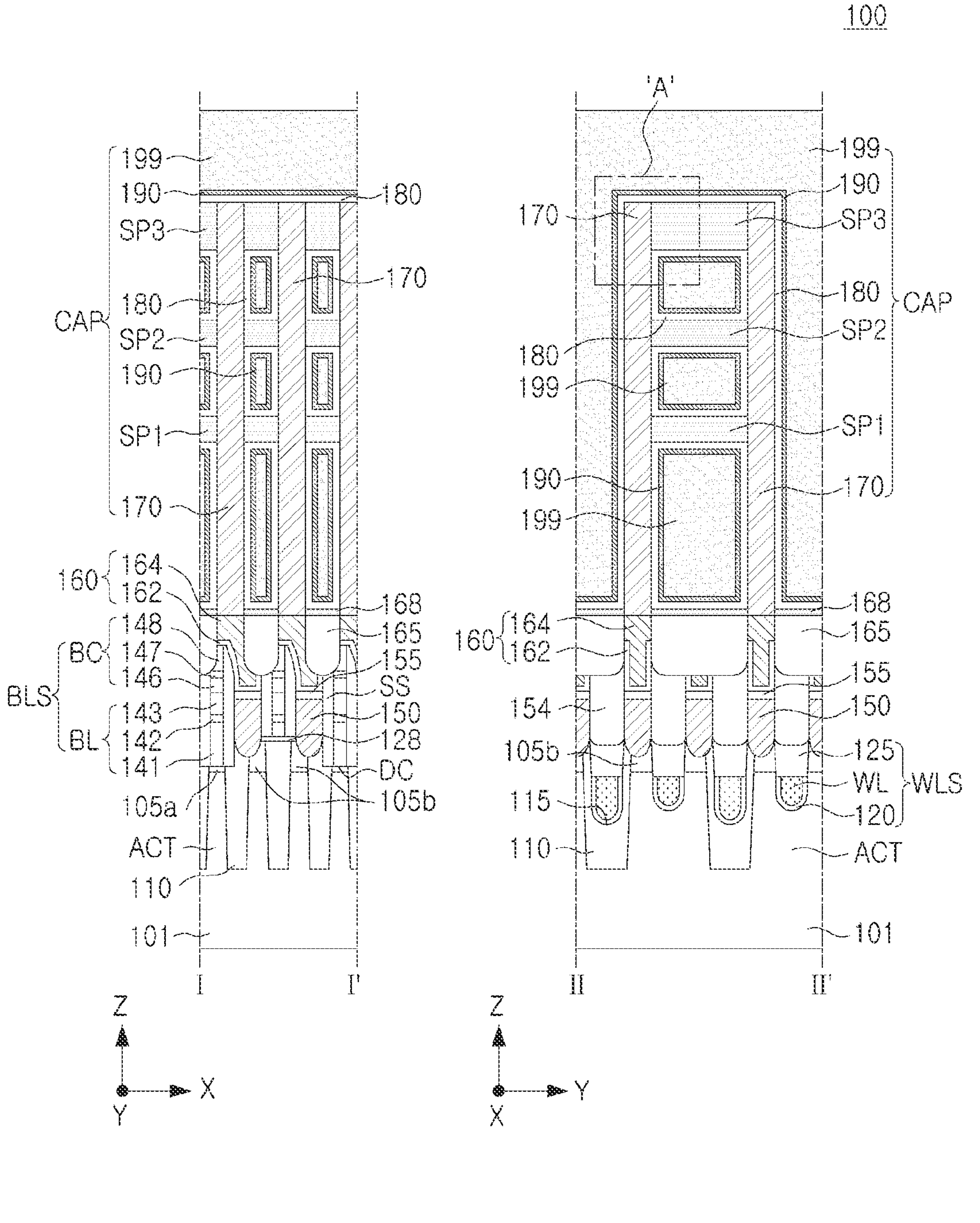
FIG. 2 is a schematic cross-sectional view of a semiconductor device according to an example embodiment.

FIG. 2 is a schematic cross-sectional view of a semiconductor device according to an example embodiment. FIG. 2 illustrates cross-sections of the semiconductor device 100 of FIG. 1 taken along lines I-I' and II-II'.

Figure 3A:
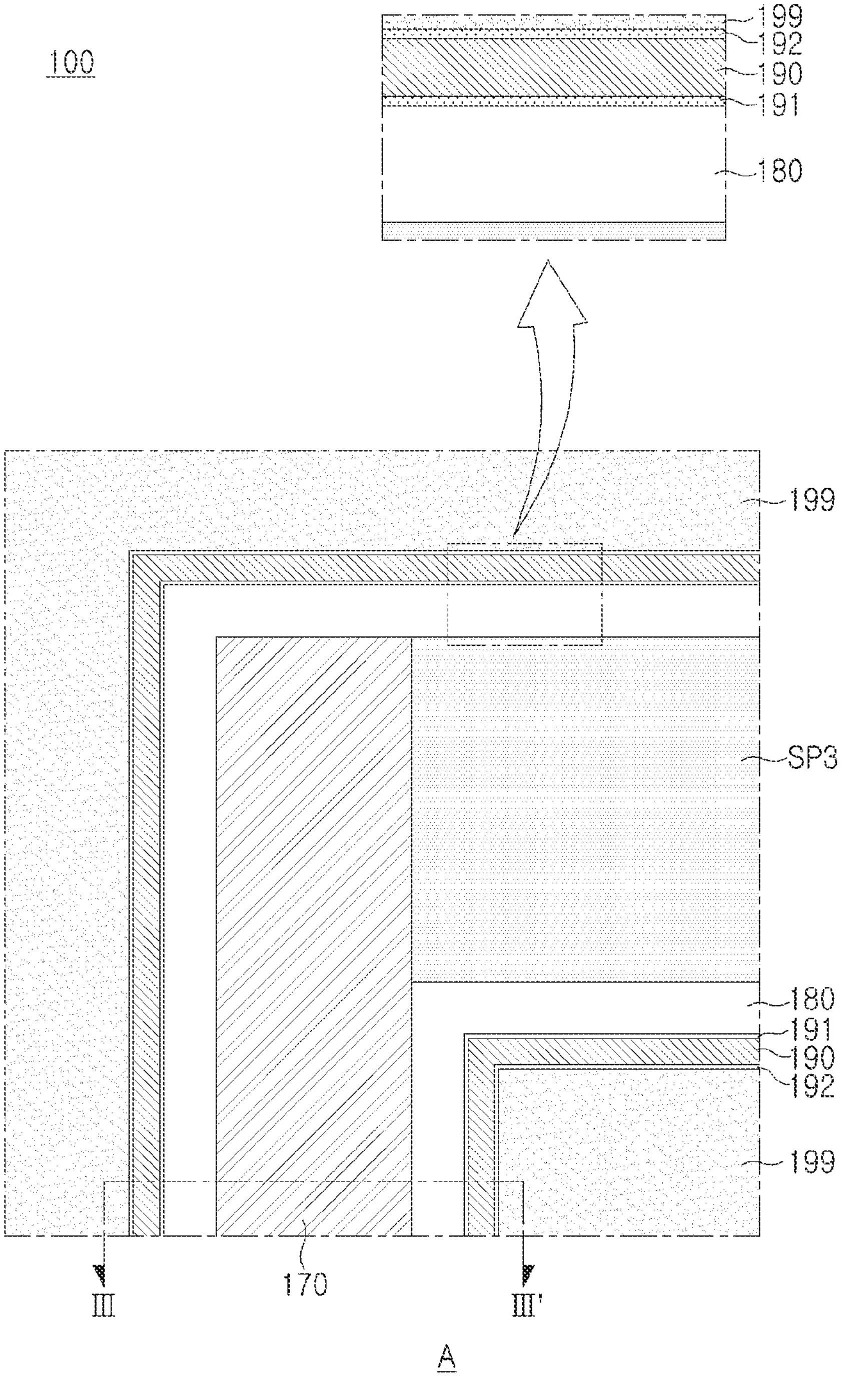
FIGS. 3A, 4A, 5A, 6A, and 7A are schematic partially enlarged views of a semiconductor device according to an example embodiment.
Figure 3B:
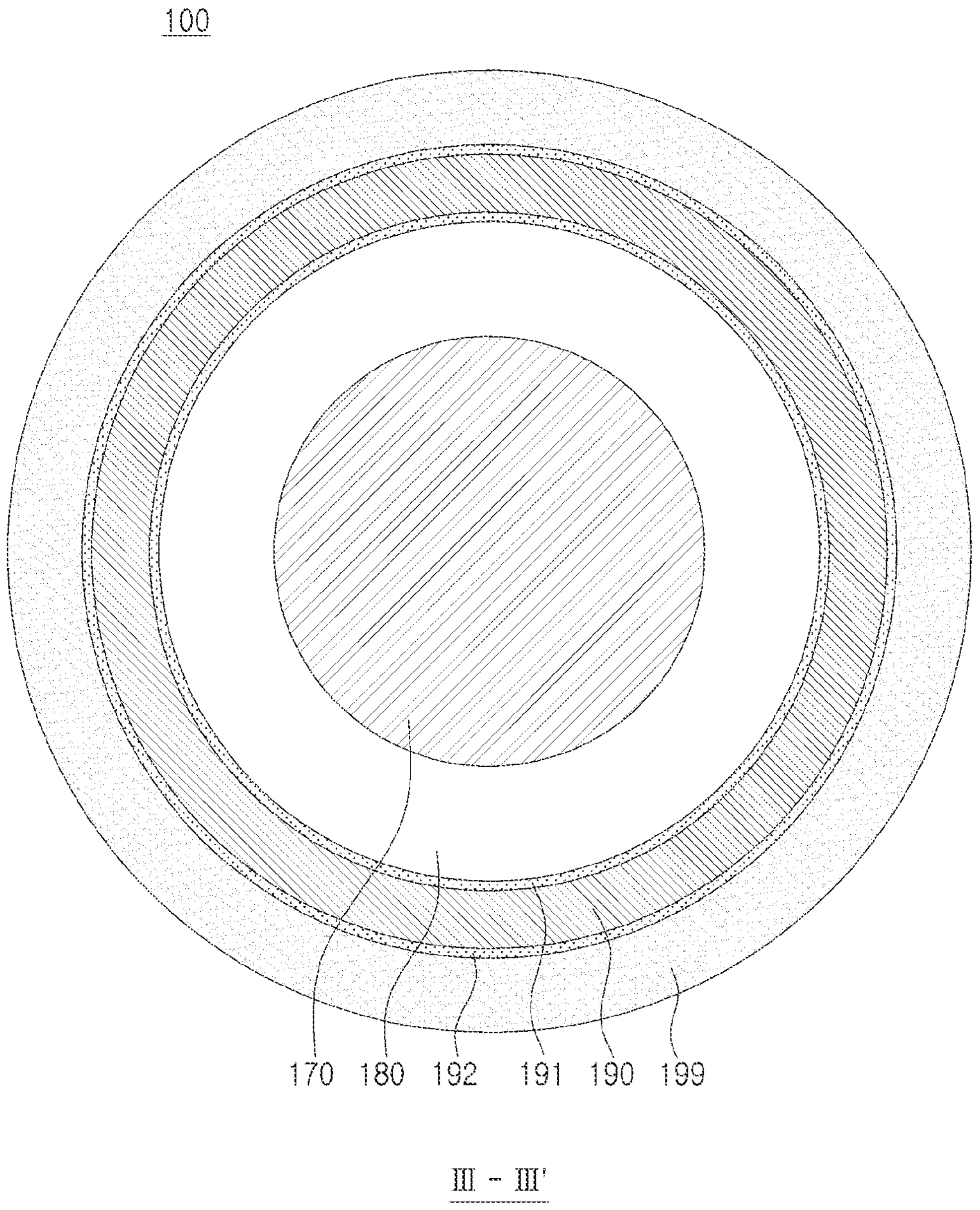
FIGS. 3B, 4B, 5B, 6B, and 7B are schematic cross-sectional views of a semiconductor device according to an example embodiment.

FIG. 3A is a partially enlarged view of the semiconductor device 100 according to an example embodiment. FIG. 3B is a cross-sectional view of the semiconductor device 100 according to an example embodiment. FIG. 3A is an enlarged view of region "A" of FIG. 2, and FIG. 3B is a cross-section of the semiconductor device 100 of FIG. 3A taken along line III-III'.

For ease of description, only main components of a semiconductor device are illustrated in FIGS. 1, 2, 3A, and 3B.

Referring to FIGS. 1, 2, 3A, and 3B, the semiconductor device 100 may include a substrate 101 including active regions ACT, an isolation layer 110 defining the active regions ACT in the substrate 101, a word line structure WLS buried in the substrate 101 to extend in a certain direction, the word line structure WLS including a word line WL, a bit line structure BLS extending to intersect the word line structure WLS on the substrate 101, the bit line structure BLS including a bit line BL, and an information storage structure CAP disposed on the bit line structure BLS. The information storage structure CAP may store information, and may be, for example, a capacitor structure of a DRAM. The semiconductor device 100 may further include a lower conductive pattern 150 disposed on the active region ACT, an upper conductive pattern 160 disposed on the lower conductive pattern 150, and an insulating pattern 165 passing or penetrating through the upper conductive pattern 160.

The semiconductor device 100 may include, for example, a cell array of a dynamic random access memory (DRAM). For example, the bit line BL may be connected to a first impurity region 105*a* of the active region ACT, and a second impurity region 105*b* of the active region ACT may be electrically connected to the information storage structure CAP on the upper conductive pattern 160 through the lower and upper conductive patterns 150 and 160.

The information storage structure CAP may be a capacitor capable of storing information in a memory such as a DRAM. The information storage structure CAP may be electrically connected to conductive regions 150 and 160 on a lower structure including the conductive regions 150 and 160, for example, the lower and upper conductive patterns 150 and 160. Here, the lower structure may include the substrate 101, the word line structure WLS, and the bit line structure BLS.

In an embodiment, the information storage structure CAP includes first electrode structures 170, a dielectric layer 180 disposed on the first electrode structures 170, second electrode structures 190, 191, and 192 disposed on the dielectric layer 180, and a plate electrode 199 disposed on the second electrode structures 190, 191, and 192. The information storage structure CAP may further include supporter layers SP1, SP2, and SP3. The first electrode structures 170 may be lower electrodes, and the second electrode structures 190, 191, and 192 may be upper electrodes. A first protective material layer 191 is formed on the dielectric layer, an electrode material layer 190 is formed on the first protective material layer 191, and a second protective material layer 192 is formed on the electrode material layer 190.

In an example embodiment, the upper electrode includes the second electrode structures 190, 191, and 192 and the plate electrode 199.

The semiconductor device 100 may include a cell array region in which a cell array is disposed and a peripheral circuit region in which peripheral circuits for driving memory cells, disposed in the cell array, are disposed. The peripheral circuit region may be disposed around the cell array region.

The substrate 101 may include a semiconductor material, for example, a Group IV semiconductor, a Group III-V compound semiconductor, or a Group II-VI compound semiconductor. For example, the Group IV semiconductor may include silicon, germanium, or silicon-germanium. The substrate 101 may further include impurities. The substrate 101 may be a silicon substrate, a silicon on insulator (SOI) substrate, a germanium substrate, a germanium on insulator (GOI) substrate, a silicon-germanium substrate, or a substrate including an epitaxial layer.

The active regions ACT may be defined in the substrate 101 by the isolation layer 110. At least one of the active regions ACT may have a bar shape, and may be disposed to have an island shape extending in one direction in the substrate 101. The one direction may be a direction inclined with respect to extension directions of the word lines WL and the bit lines BL. The active regions ACT may be arranged to be parallel to each other, and an end of one of the active regions ACT may be arranged adjacent to a central portion of another one of the active regions ACT adjacent thereto.

One of the active regions ACT may have first and second impurity regions 105*a* and 105*b* having a predetermined depth from an upper surface of the substrate 101. In an embodiment, the first and second impurity regions 105*a* and 105*b* are spaced apart from each other. The first and second impurity regions 105*a* and 105*b* may serve as a source/drain region of a transistor formed by the word line WL. The source region and the drain region, which are formed by the first and second impurity regions 105*a* and 105*b* caused by doping or ion implantation of substantially the same impurities, may be interchangeably referred to depending on a circuit configuration of a finally formed transistor. The impurities may include impurities having a conductivity type opposite to that of the substrate 101. In an example embodiment, depths of the first and second impurity regions 105*a* and 105*b* in the source region and the drain region are different from each other.

The isolation layer 110 may be formed by a shallow trench isolation (STI) process. The isolation layer 110 may electrically isolate the active regions ACT from each other while surrounding the active regions ACT. The isolation layer 110 may be formed of an insulating material, for example, silicon oxide, silicon nitride, or a combination thereof. The isolation layer 110 may include a plurality of regions having different lower end depths depending on a width of a trench in which the substrate 101 is etched.

The word line structures WLS may be disposed in gate trenches 115 extending in the substrate 101. In an embodiment, each of the word line structures WLS include a gate dielectric layer 120, the word line WL, and a gate capping layer 125. In this specification, a "gate 120 and WL" may be referred to as a structure including the gate dielectric layer 120 and the word line WL, and the word line WL may be referred to as a "gate electrode," and the word line structure WLS may be referred to as a "gate structure."

The word line WL may be disposed to extend in a first direction X across one of the active regions ACT. For example, a pair of word lines WL adjacent to each other may be disposed to cross one of the active regions ACT. The word line WL may form a gate of a buried channel array transistor (BCAT), but the present inventive concept is not limited thereto. In an example embodiment, the word lines WL is disposed on an upper portion of the substrate 101. The word line WL may be disposed on a lower portion of a gate trench 115 to have a predetermined thickness. In an embodiment, an upper surface of the word line WL is positioned on a level lower than that of the upper surface of the substrate 101. In this specification, the high and the low of the term “level” may be defined based on a substantially flat upper surface of the substrate 101.

The word line WL may include a conductive material, for example, at least one of polycrystalline silicon (Si), titanium (Ti), titanium nitride (TiN), tantalum (Ta), tantalum nitride (TaN), tungsten (W), tungsten nitride (WN), and aluminum (Al). For example, the word line WL may include a lower pattern and an upper pattern formed of different materials. The lower pattern may include at least one of tungsten (W), titanium (Ti), tantalum (Ta), tungsten nitride (WN), titanium nitride (TiN), and tantalum nitride (TaN). The upper pattern may be a semiconductor pattern including polysilicon doped with a P-type or N-type impurity.

The gate dielectric layer 120 may be disposed on a bottom surface and internal side surfaces of the gate trench 115. The gate dielectric layer 120 may conformally or uniformly cover an inner wall of the gate trench 115. The gate dielectric layer 120 may include at least one of silicon oxide, silicon nitride, and silicon oxynitride. The gate dielectric layer 120 may be, for example, a silicon oxide film or an insulating film having a high dielectric constant. In an example embodiment, the gate dielectric layer 120 includes a layer formed by oxidizing the active region ACT or a layer formed by deposition.

The gate capping layer 125 may be disposed to fill the gate trench 115 on an upper portion of the word line WL. In an embodiment, an upper surface of the gate capping layer 125 is positioned on a level the same or substantially the same as that of the upper surface of the substrate 101. The gate capping layer 125 may be formed of an insulating material, for example, silicon nitride.

The bit line structure BLS may extend in a direction, perpendicular to the word line WL, for example, a second direction Y. The bit line structure BLS may include a bit line BL and a bit line capping pattern BC disposed on the bit line BL.

The bit line BL may include a first conductive pattern 141, a second conductive pattern 142, and a third conductive pattern 143 that are sequentially stacked. For example, the second conductive pattern 142 may formed on the first conductive pattern 141, and the third conductive pattern 143 may be formed on the second conductive pattern 142. The bit line capping pattern BC may be disposed on the third conductive pattern 143. A buffer insulating layer 128 may be disposed between the first conductive pattern 141 and the substrate 101. In an embodiment, a portion of the first conductive pattern 141 (hereinafter, a bit line contact pattern DC) is in contact with the first impurity region 105*a* of the active region ACT. The bit line BL may be electrically connected to the first impurity region 105*a* through the bit line contact pattern DC. In an embodiment, a lower surface of the bit line contact pattern DC is positioned on a level lower than that of the upper surface of the substrate 101, and is positioned on a level higher than that of the upper surface of the word line WL. In an example embodiment, the bit line contact pattern DC may be formed in the substrate 101 to be locally disposed in a bit line contact hole exposing the first impurity region 105*a*.

The first conductive pattern 141 may include a semiconductor material such as polycrystalline silicon. In an embodiment, the first conductive pattern 141 is in direct contact with the first impurity region 105*a*. The second conductive pattern 142 may include a metal-semiconductor compound. The metal-semiconductor compound may be, for example, a layer obtained by silicidating a portion of the first conductive pattern 141. For example, the metal-semiconductor compound may include cobalt silicide (CoSi), titanium silicide (TiSi), nickel silicide (NiSi), tungsten silicide (WSi), or other metal silicide. The third conductive pattern 143 may include a metal material such as titanium (Ti), tantalum (Ta), tungsten (W), and aluminum (Al). In some example embodiments, the number of conductive patterns forming the bit line BL, a type of material, and/or a stacking order may be changed in various manners.

The bit line capping pattern BC may include a first capping pattern 146, a second capping pattern 147, and a third capping pattern 148 sequentially stacked on the third conductive pattern 143. For example, the first capping pattern 146 may be formed on the third conductive pattern 143, the second capping pattern 147 may be formed on the first capping pattern 146, and the third capping pattern 148 may be formed on the second capping pattern 147. Each of the first to third capping patterns 146, 147, and 148 may include an insulating material, for example, a silicon nitride film. The first to third capping patterns 146, 147, and 148 may be formed of different materials. Even when the first to third capping patterns 146, 147, and 148 include the same material, the first to third capping patterns 146, 147, and 148 may be distinguished from each other by a difference in physical properties. In an embodiment, a thickness of the second capping pattern 147 is narrower than a thickness of the first capping pattern 146 and a thickness of the third capping pattern 148, respectively. In some example embodiments, the number of capping patterns and/or a type of material forming the bit line capping pattern BC may be changed in various manners.

Spacer structures SS may be disposed on opposite sidewalls of each of the bit line structures BLS to extend in a direction, for example, a Y-direction. The spacer structures SS may be disposed between the bit line structure BLS and the lower conductive pattern 150. The spacer structures SS may be disposed to extend along sidewalls of the bit line BL and sidewalls of the bit line capping pattern BC. A pair of spacer structures SS disposed on opposite sides of one bit line structure BLS may have an asymmetric shape with respect to the bit line structure BLS. Each of the spacer structures SS may include a plurality of spacer layers, and may further include an air spacer in some example embodiments. For example, a spacer structure SS may include an internal air pocket.

The lower conductive pattern 150 may be connected to a region of the active region ACT, for example, the second impurity region 105*b*. The lower conductive pattern 150 may be disposed between the bit lines BL and between the word lines WL. The lower conductive pattern 150 may pass or penetrate through the buffer insulating layer 128 to be connected to the second impurity region 105*b* of the active region ACT. In an embodiment, the lower conductive pattern 150 is in direct contact with the second impurity region 105*b*. In an embodiment, a lower surface of the lower conductive pattern 150 is positioned on a level lower than that of the upper surface of the substrate 101, and is positioned on a level higher than that of the lower surface of the bit line contact pattern DC. The lower conductive pattern 150 may be insulated from the bit line contact pattern DC by the spacer structure SS. The lower conductive pattern 150 may be formed of a conductive material. For example, the lower conductive pattern 150 may include at least one of polycrystalline silicon (Si), titanium (Ti), titanium nitride (TiN), tantalum (Ta), tantalum nitride (TaN), tungsten (W), tungsten nitride (WN), and aluminum (Al). In an example embodiment, the lower conductive pattern 150 includes a plurality of layers.

A metal-semiconductor compound layer 155 may be disposed between the lower conductive pattern 150 and the upper conductive pattern 160. The metal-semiconductor compound layer 155 may be, for example, a layer obtained by silicidating a portion of the lower conductive pattern 150 when the lower conductive pattern 150 includes a semiconductor material. The metal-semiconductor compound layer 155 may include, for example, cobalt silicide (CoSi), titanium silicide (TiSi), nickel silicide (NiSi), tungsten silicide (WSi), or other metal silicide. In an example embodiment, the metal-semiconductor compound layer 155 is omitted. When the metal-semiconductor compound layer 155 is omitted, an upper conductive pattern 160 may contact the lower conductive pattern 150.

The upper conductive pattern 160 may be disposed on the lower conductive pattern 150. The upper conductive pattern 160 may extend between the spacer structures SS to cover an upper surface of the metal-semiconductor compound layer 155. In an embodiment, the upper conductive pattern 160 includes a barrier layer 162 and a conductive layer 164. The barrier layer 162 may cover a lower surface and side surfaces of the conductive layer 164. The barrier layer 162 may include a metal nitride, for example, at least one of titanium nitride (TiN), tantalum nitride (TaN), and tungsten nitride (WN). The conductive layer 164 may include a conductive material, for example, at least one of polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), and tungsten nitride (WN).

Insulating patterns 165 may be disposed to pass or penetrate through the upper conductive pattern 160. The upper conductive pattern 160 may be divided into a plurality of upper conductive patterns by the insulating patterns 165. The insulating patterns 165 may include an insulating material, for example, at least one of silicon oxide, silicon nitride, and silicon oxynitride.

An etch stop layer 168 may cover the insulating patterns 165 between the first electrode structures 170. In an embodiment, the etch stop layer 168 is in contact with lower regions of side surfaces of the first electrode structures 170. The etch stop layer 168 may be disposed below the supporter layers SP1, SP2, and SP3. In an embodiment, an upper surface of the etch stop layer 168 includes a portion in direct contact with the dielectric layer 180. The etch stop layer 168 may include, for example, at least one of silicon nitride and silicon oxynitride.

The first electrode structures 170 may be disposed on the upper conductive patterns 160. The first electrode structures 170 may pass or penetrate through the etch stop layer 168 to be in contact with the upper conductive patterns 160. The first electrode structures 170 may have a pillar shape, but the present inventive concept is not limited thereto. Each of the first electrode structures 170 may include at least one or combinations of niobium nitride (NbN), niobium oxide (NbOx), polycrystalline silicon (Si), iridium (Ir), titanium (Ti), titanium nitride (TiN), titanium silicide nitride (TiSiN), tantalum (Ta), tantalum nitride (TaN), tungsten (W), tungsten nitride (WN), and aluminum (Al), a metal nitride, a metal compound, and the like.

The dielectric layer 180 may cover a side surface and an upper surface of each of the first electrode structures 170 on the surfaces of the first electrode structures 170. The dielectric layer 180 may be disposed between the first electrode structures 170 and the electrode structure 190. The dielectric layer 180 may cover upper surfaces and lower surfaces of the supporter layers SP1, SP2, and SP3. The dielectric layer 180 may cover an upper surface of the etch stop layer 168.

The dielectric layer 180 may include a high-κ dielectric material, silicon oxide, silicon nitride, or combinations thereof. However, in some example embodiments, the dielectric layer 180 may include an oxide, nitride, silicide, oxynitride, or silicified oxynitride including at least one or combinations of titanium (Ti) doped with fluorine (F), tantalum (Ta), hafnium (Hf), aluminum (Al), zirconium (Zr), and lanthanum (La).

The second electrode structures 190, 191, and 192 may include a plurality of alternately stacked layers. For example, the second electrode structures 190, 191, and 192 may include one or more protective material layers and one or more electrode material layers. For example, the second electrode structures 190, 191, and 192 may include a first protective material layer 191, an electrode material layer 190, and a second protective material layer 192 sequentially stacked. The plurality of layers may include one or more electrode material layers 190 and one or more protective material layers 191 and 192. In an embodiment, a thickness of each of the one or more electrode material layers 190 is greater than that of each of the one or more protective material layers 191 and 192. In an embodiment, the one or more electrode material layers 190 and the one or more protective material layers 191 and 192 include the same metal element. The one or more electrode material layers 190 may further include a nitrogen element, and the one or more protective material layers 191 and 192 may further include a silicon element and an oxygen element. In an embodiment, the one or more electrode material layers 190 do not include any oxygen element.

In an embodiment, each of the one or more electrode material layers 190 include a first material, and at least one of the one or more protective material layers 191 and 192 include at least one of a second material and a third material. According to an example embodiment, the first material may be a metal nitride including a metal element and a nitrogen element, the second material may include a metal element, a silicon element, and an oxygen element, and the third material may include a metal element, a silicon element, an oxygen element and a nitrogen element. For example, the first material may be TiN, the second material may be a Titanium Silicon Oxide (TiSiO) material, and the third material may be a Titanium Oxynitride (TiSiON) material.

The one or more protective material layers 191 and 192 may be plural in number, and the plurality of protective material layers 191 and 192 may include the first protective material layer 191 and the second protective material layer 192 spaced apart from each other. In an embodiment, the first protective material layer 191 is in contact with the dielectric layer 180, and the second protective material layer 192 is in contact with the plate electrode 199.

In an embodiment, the electrode material layer 190 covers a plurality of first electrode structures 170, the supporter layers SP1, SP2, and SP3, and the dielectric layer 180. The electrode material layer 190 may extend along a surface of the dielectric layer 180. According to an example embodiment, the electrode material layer 190 may be disposed between the first protective material layer 191 and the second protective material layer 192. The electrode material layer 190 may be spaced apart from the dielectric layer 180 by the first protective material layer 191 to be described below, but the present inventive concept is not limited thereto. In addition, the electrode material layer 190 may be spaced apart from the plate electrode 199 to be described below by the second protective material layer 192 to be described below. In an embodiment, a thickness of the electrode material layer 190 is less than a thickness of the dielectric layer 180. In an embodiment, a thickness of the electrode material layer 190 is greater than that of each of the first protective material layer 191 and the second protective material layer 192.

As illustrated in FIG. 2, the electrode material layer 190 may include a single electrode layer, but the present inventive concept is not limited thereto. In other example embodiments, the electrode material layer 190 may include a plurality of electrode layers. The electrode material layer 190 may include a conductive material. The electrode material layer 190 may include, for example, at least one or combinations of TiN, NbN, WN, VN, MoN, TaN, TiSiN, and TiCN, a metal nitride, a metal compound, and the like. According to an example embodiment, the electrode material layer 190 may include a first metal element and a nitrogen element. In an embodiment, the electrode material layer 190 does not include any oxygen element.

The first protective material layer 191 may be disposed between the dielectric layer 180 and the plate electrode 199 to be described below. For example, the first protective material layer 191 may be disposed between the electrode material layer 190 and the dielectric layer 180. In an embodiment, the first protective material layer 191 is in contact with the electrode material layer 190 and the dielectric layer 180. The first protective material layer 191 may cover at least a portion of a lower surface or an upper surface of the electrode material layer 190. In an embodiment, a thickness of the first protective material layer 191 is less than that of the electrode material layer 190.

The first protective material layer 191 may include a second metal element, a Group 14 element of the periodic table of elements, and an oxygen element. The first metal element of the electrode material layer 190 and the second metal element of the first protective material layer 191 may be the same elements. The first metal element and the second metal element, the same as each other, may include at least one of titanium (Ti), chrominum (Cr), niobium (Nb), hafnium (Hf), and zirconium (Zr). According to an example embodiment, the first protective material layer 191 may include a metal element such as titanium (Ti), tantalum (Ta), tungsten (W), aluminum (Al), or the like. In addition, the first protective material layer 191 may include a metal element included in the electrode material layer 190. The Group 14 element of the first protective material layer 191 may be silicon (Si). The first protective material layer 191 may include at least one of oxygen (O) and nitrogen (N). For example, the first protective material layer 191 may include at least one of metal-silicon oxide, metal-silicon nitride, and metal-silicon oxynitride.

The second protective material layer 192 may oppose the first protective material layer 191, and may be disposed on the electrode material layer 190. The second protective material layer 192 may be disposed between the dielectric layer 180 and the plate electrode 199 to be described below. For example, the second protective material layer 192 may be disposed between the electrode material layer 190 and the plate electrode 199 to be described below. In an embodiment, the second protective material layer 192 is in contact with both the electrode material layer 190 and the plate electrode 199. The second protective material layer 192 may cover at least a portion of a lower surface or an upper surface of the electrode material layer 190. In an embodiment, a thickness of the second protective material layer 192 is less than that of the electrode material layer 190.

The second protective material layer 192 may include a second metal element, a Group 14 element of the periodic table of elements, and an oxygen element. The first metal element of the electrode material layer 190 and the second metal element of the second protective material layer 192 may be the same elements. The first metal element and the second metal element, the same as each other, may include at least one of titanium (Ti), chrominum (Cr), niobium (Nb), hafnium (Hf), and zirconium (Zr). According to an example embodiment, the second protective material layer 192 may include metal elements such as titanium (Ti), tantalum (Ta), tungsten (W), and aluminum (Al). In addition, the second protective material layer 192 may include a metal element included in the electrode material layer 190. The Group 14 element of the second protective material layer 192 may be silicon (Si). The second protective material layer 192 may include at least one of oxygen (O) and nitrogen (N). For example, the second protective material layer 192 may include at least one of metal-silicon oxide, metal-silicon nitride, and metal-silicon oxynitride. A material of the second protective material layer 192 may be the same as a material of the first protective material layer 191, but the present inventive concept is not limited thereto. In an embodiment, the material of the second protective material layer 192 is different from materials of the first protective material layer 191 and the electrode material layer 190. For example, the first protective material layer 191 may be TiSiO or TiSiON, and the second protective material layer 192 may be TiSiO or TiSiON. For example, the first protective material layer 191 could be TiSiO while the second protective material layer 192 is TiSiON.

In an embodiment, the first protective material layer 191 and the second protective material layer 192 include silicon, thereby preventing natural oxidation of the electrode material layer 190 and oxidation by the dielectric layer 190. The concentration of oxygen decreases as the concentration of silicon increases as confirmed by time-of-flight secondary ion mass spectrometry (ToF-SIMS). In addition, the first protective material layer 191 and the second protective material layer 192 may increase crystallinity of the electrode material layer 190. As a result, a sheet resistance of the electrode material layer 190 according to the present inventive concept may be less than a sheet resistance of the electrode material layer 190 when the first protective material layer 191 and the second protective material layer 192 are not present. According to an example embodiment, due to the first protective material layer 191 and the second protective material layer 192, the sheet resistance of the electrode material layer 190 may have a value less than 100000 μΩ/sqr. For example, when the first protective material layer 191 and the second protective material layer 192 are formed through a cyclic CVD process using dichlorosilane (DCS) or the like, the sheet resistance of the electrode material layer 190 may have a value less than 50000 μΩ/sqr. Even when the thickness of the electrode material layer 190 in an embodiment of the inventive concept is about 5 Å less than a thickness of the electrode material layer 190 in a comparative embodiment, the sheet resistance of the electrode material layer 190 may be reduced as described above, such that the information storage structure CAP may have a reduced size. Accordingly, the semiconductor device 100 having increase electrical properties may be provided by forming the first protective material layer 191 and the second protective material layer 192 on the electrode material layer 190.

The first protective material layer 191 and the second protective material layer 192 may include silicon, such that a structure analysis using transmission electron microscopy electron energy loss spectroscopy (TEM-EELS) may be performed to verify whether the first protective material layer 191 and the second protective material layer 192 are present. In addition, the presence or absence of silicon may be verified by ToF-SIMS to verify whether the first protective material layer 191 and the second protective material layer 192 are present.

The plate electrode 199 may be disposed on the electrode material layer 190. According to an example embodiment, the plate electrode 199 is disposed on the second protective material layer 192. The plate electrode 199 may fill a space between the plurality of first electrode structures 170 and a space between the supporter layers SP1, SP2, and SP3. The plate electrode 199 may include a conductive material. For example, the plate electrode 199 may include a silicon material or a silicon-germanium material. For example, the plate electrode 199 may include a doped silicon material or a doped silicon-germanium material.

The supporter layers SP1, SP2, and SP3 may include a first supporter layer SP1, a second supporter layer SP2 disposed on the first supporter layer SP1, and a third supporter layer SP3 disposed on the second supporter layer SP2. The supporter layers SP1, SP2, and SP3 may be spaced apart from the substrate 101 in a direction, perpendicular to an upper surface of the substrate 101. In an embodiment, the supporter layers SP1, SP2, SP3 are in contact with the first electrode structures 170, and may extend in a direction, parallel to the upper surface of the substrate 101.

The supporter layers SP1, SP2, and SP3 may include a portion in direct contact with the first electrode structures 170 and the dielectric layer 180. The third supporter layer SP3 may have a thickness greater than those of the first supporter layer SP1 and the second supporter layer SP2, but the present inventive concept is not limited thereto. The supporter layers SP1, SP2, and SP3 may be layers supporting first electrode structures 170 having a high aspect ratio. The supporter layers SP1, SP2, and SP3 may each include, for example, at least one of silicon nitride and silicon oxynitride, or a material similar thereto. The number, thickness, and/or arrangement of the supporter layers SP1, SP2, and SP3 are not limited to those illustrated, and may be changed in various manners in some example embodiments.

At least one of the supporter layers SP1, SP2, and SP3, supporting the first electrode structures 170, may be provided between adjacent first electrode structures 170. For example, the first supporter layer SP1, the second supporter layer SP2, and the third supporter layer SP3 in contact with the first electrode structures 170 may be provided between the adjacent first electrode structures 170.

Referring to FIG. 1, in a plan view viewed from above, the first electrode structures 170 may have a regular arrangement. In example embodiments, the first electrode structures 170 may be spaced apart by a predetermined distance in the first direction X, and may be disposed in a zigzag pattern in the second direction Y. However, the arrangement of the first electrode structures 170 is not limited thereto.

A through-hole pattern may be disposed between a plurality of adjacent first electrode structures 170. In an example embodiment, a single through-hole pattern is disposed between four adjacent first electrode structures 170, as illustrated in connection with the semiconductor device 100 of FIG. 1. However, the through-hole pattern is not limited thereto.

Semiconductor devices according to example embodiments will be described with reference to FIGS. 4A to 7B. The semiconductor devices illustrated in FIGS. 4A to 7B are different from those in the above-described example embodiments of FIGS. 1 to 3B, in terms of structures of an electrode material layer 190, a first protective material layer 191, a second protective material layer 192, and third protective material layers 193.

In the example embodiments of FIGS. 4A to 7B, components having the same reference numerals may have features the same as or similar to the above-described features. In the description of the following example embodiments, contents overlapping those described with reference to FIGS. 1 to 3B will be omitted.

Figure 4A:
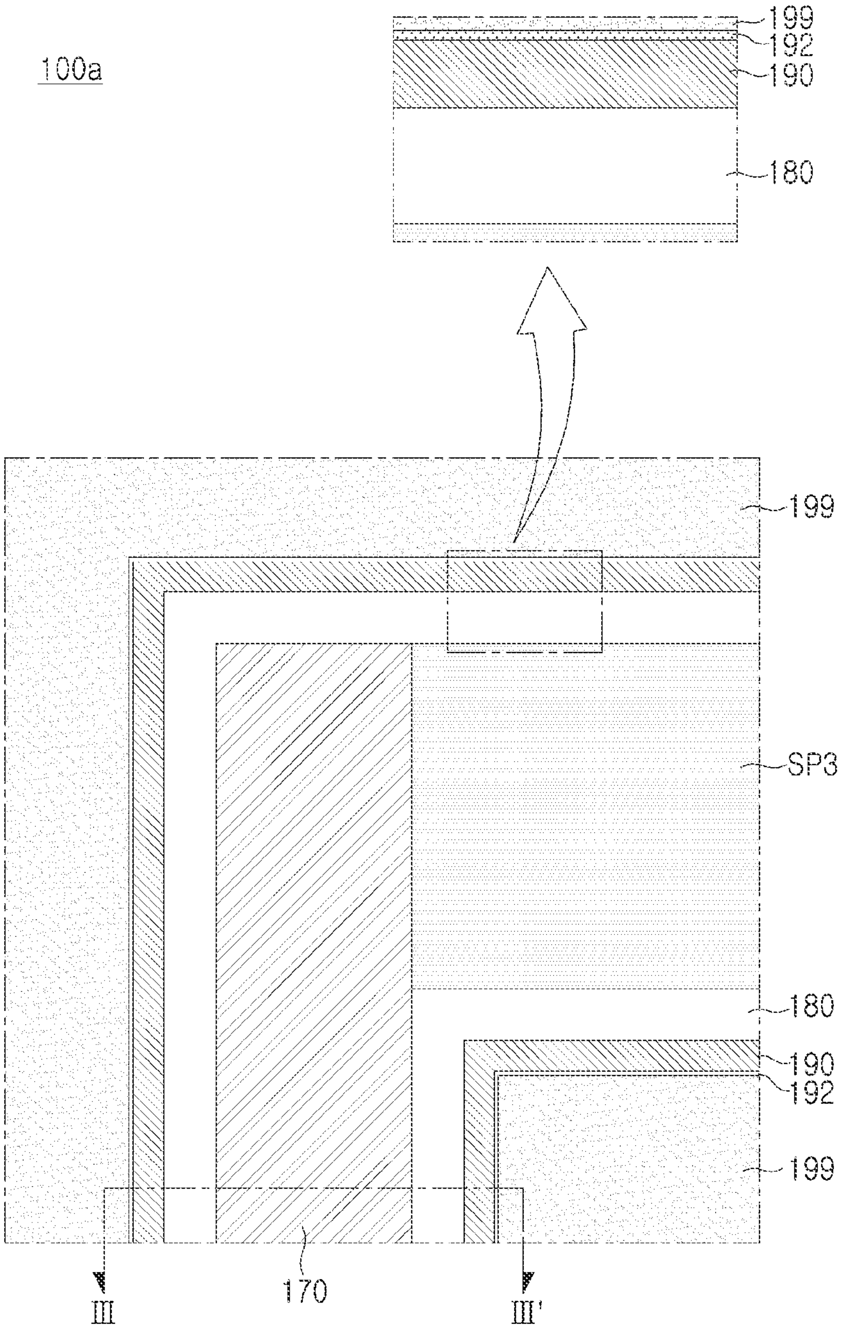
Figure 4B:
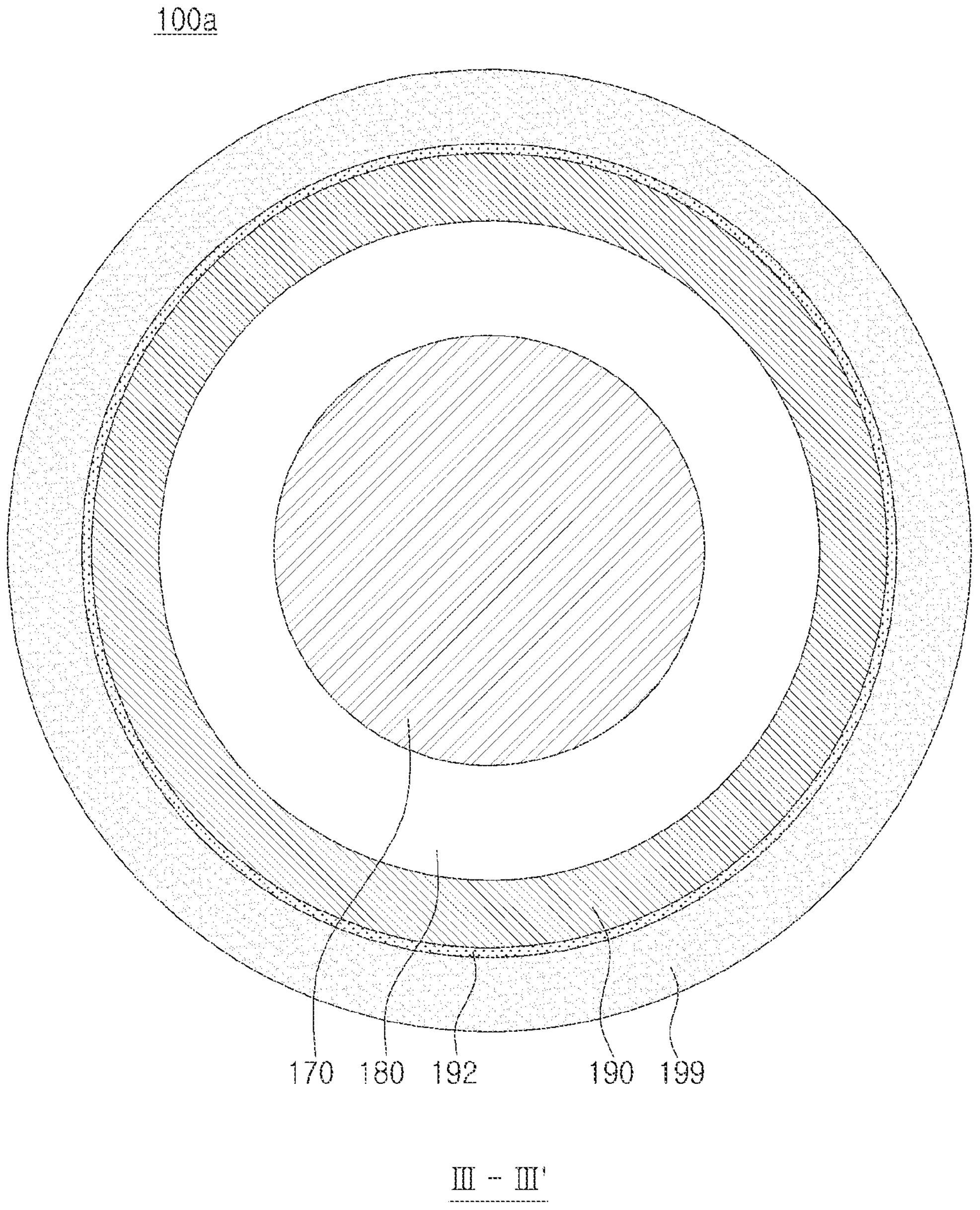

FIG. 4A is a partially enlarged view of a portion of an information storage structure of a semiconductor device according to an example embodiment, and FIG. 4B is a cross-sectional view of an information storage structure of a semiconductor device 100*a* according to an example embodiment. FIG. 4A illustrates a region corresponding to region “A” of FIG. 2, and FIG. 4B illustrates a cross-section taken along a region corresponding to line III-III' of FIG. 4A.

Referring to FIGS. 4A and 4B, unlike the semiconductor device 100 of FIG. 3A, an electrode material layer 190 and a second protective material layer 192 are formed without a process of forming a first protective material layer 191. As a result, the electrode material layer 190 may be in contact with the dielectric layer 180. The second protective material layer 192 may prevent the electrode material layer 190 from being naturally oxidized, thereby increasing the sheet resistance of the electrode material layer 190.

On a level of line III-III' of FIG. 4A, the information storage structure may include a first electrode structure 170, a dielectric layer 180 surrounding an external surface of the first electrode structure 170, an electrode material layer 190 surrounding an external surface of the dielectric layer 180, a second protective material layer 192 surrounding an external surface of the electrode material layer 190, and a plate electrode 199 surrounding an external surface of the second protective material layer 192. The electrode material layer 190 may be disposed between the dielectric layer 180 and the second protective material layer 192. The second protective material layer 192 may be disposed between the electrode material layer 190 and the plate electrode 199. In an embodiment, the second protective material layer 192 contacts both the electrode material layer 190 and the plate electrode 199.

Figure 5A:
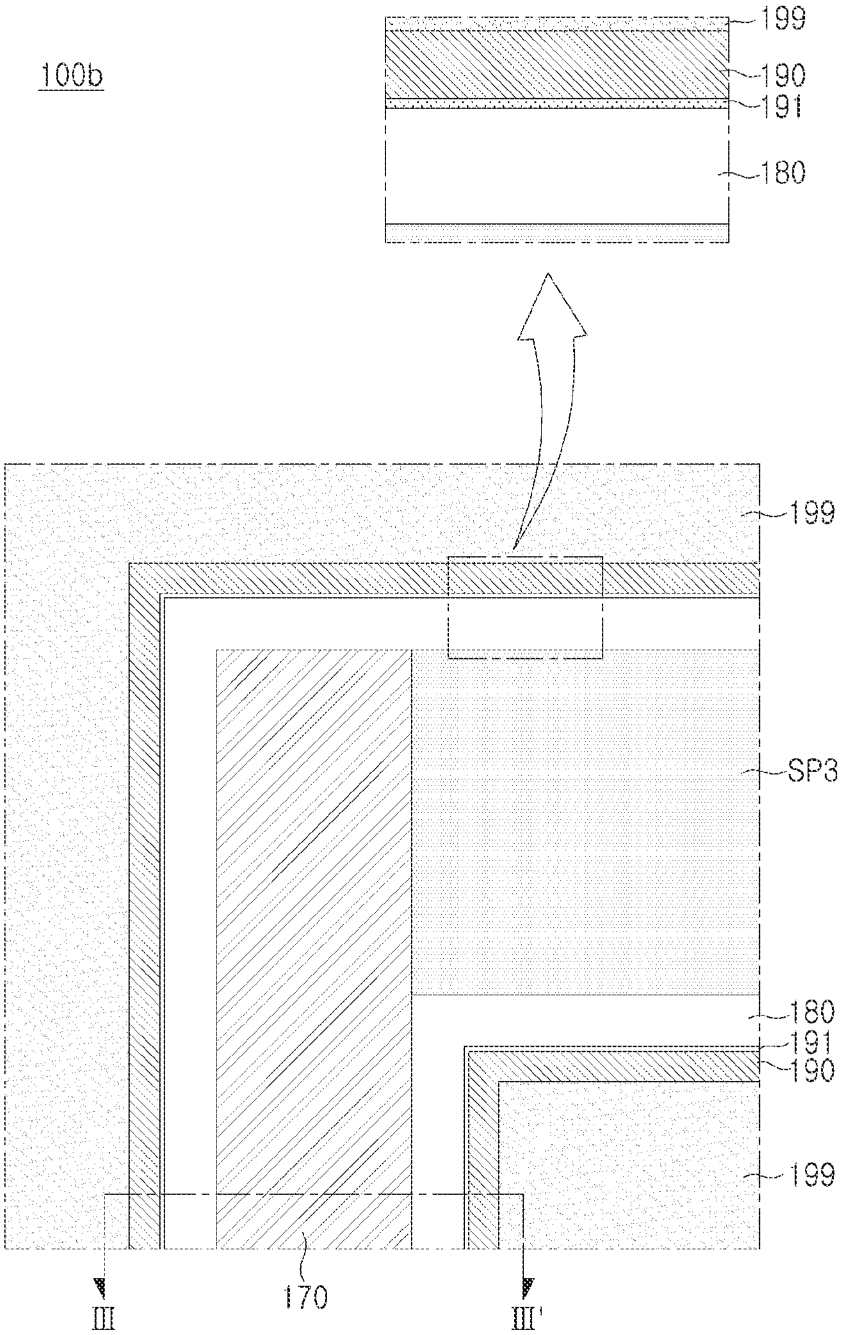
Figure 5B:
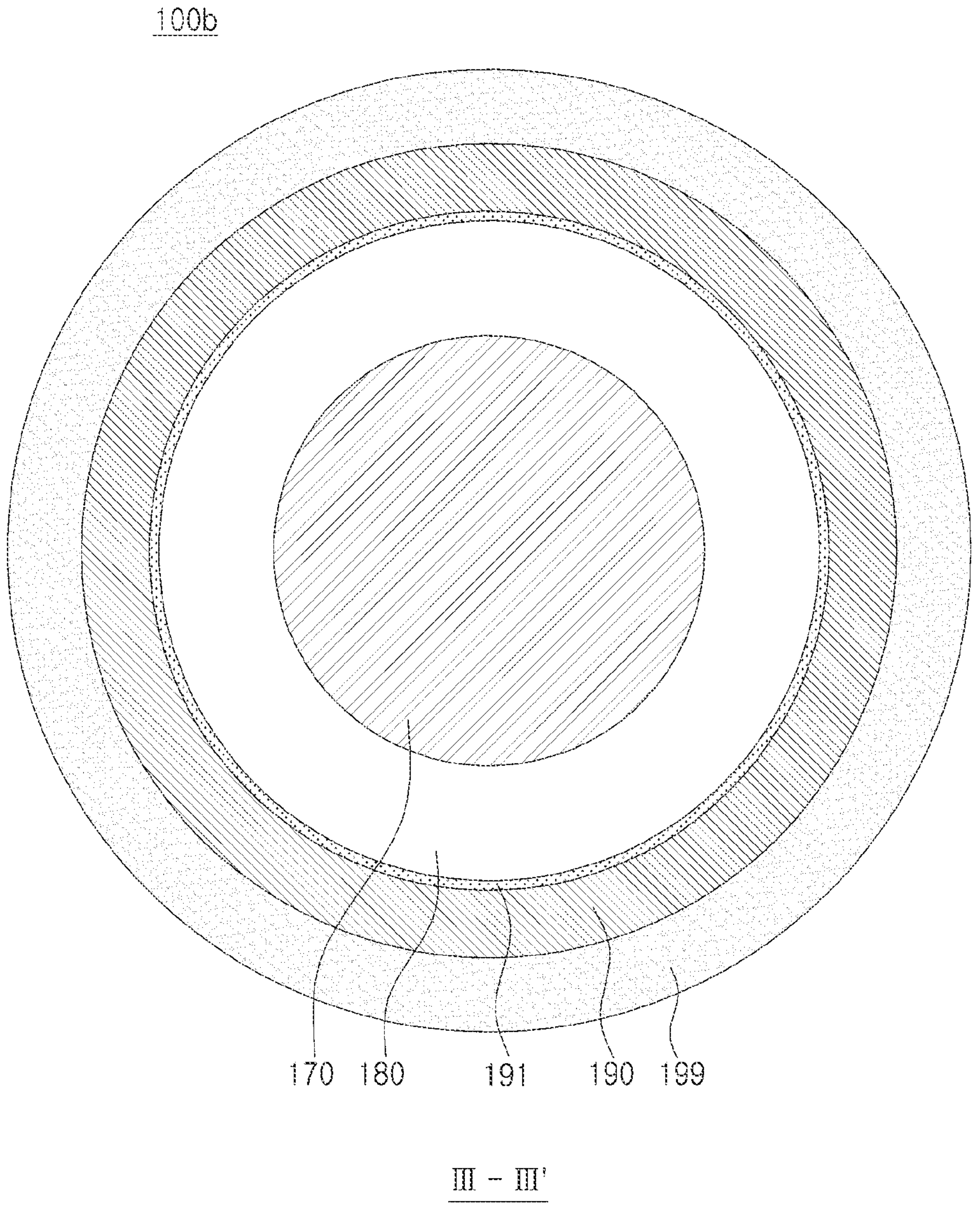

FIG. 5A is a partially enlarged view of a portion of an information storage structure of a semiconductor device according to an example embodiment, and FIG. 5B is a cross-sectional view illustrating an information storage structure of a semiconductor device 100*b* according to an example embodiment. FIG. 5A illustrates a region corresponding to region “A” of FIG. 2, and FIG. 5B illustrates a cross-section taken along a region corresponding to line III-III' of FIG. 5A.

Referring to FIGS. 5A and 5B, unlike the semiconductor device 100 of FIG. 3A, an electrode material layer 190 and a first protective material layer 191 may be formed without a process of forming a second protective material layer 192. As a result, the electrode material layer 190 may be in contact with a plate electrode 199. The first protective material layer 191 may prevent the electrode material layer

190 from being oxidized by the dielectric layer 180, thereby preventing the sheet resistance of the electrode material layer 190.

On a level of line III-III' of FIG. 5A, the information storage structure may include a first electrode structure 170, a dielectric layer 180 surrounding an external surface of the first electrode structure 170, a first protective material layer 191 surrounding an external surface of the dielectric layer 180, an electrode material layer 190 surrounding an external surface of the first protective material layer 191, and a plate electrode 199 surrounding an external surface of the electrode material layer 190. The first protective material layer 191 may be disposed between the dielectric layer 180 and the electrode material layer 190. The electrode material layer 190 may be disposed between the first protective material layer 191 and the plate electrode 199. In an embodiment, the electrode material layer 190 contacts both the first protective material layer 191 and the plate electrode 199.

Figure 6A:
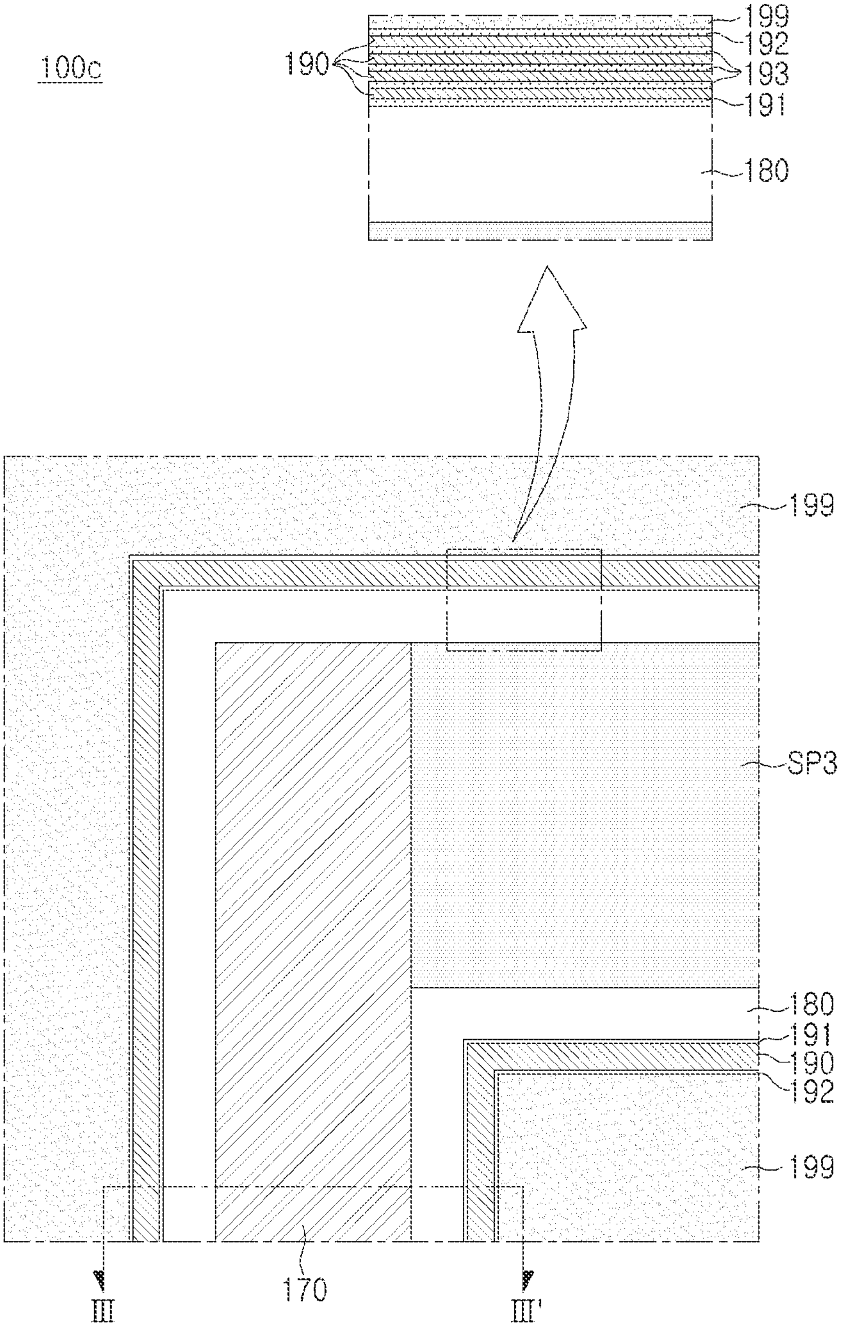
Figure 6B:
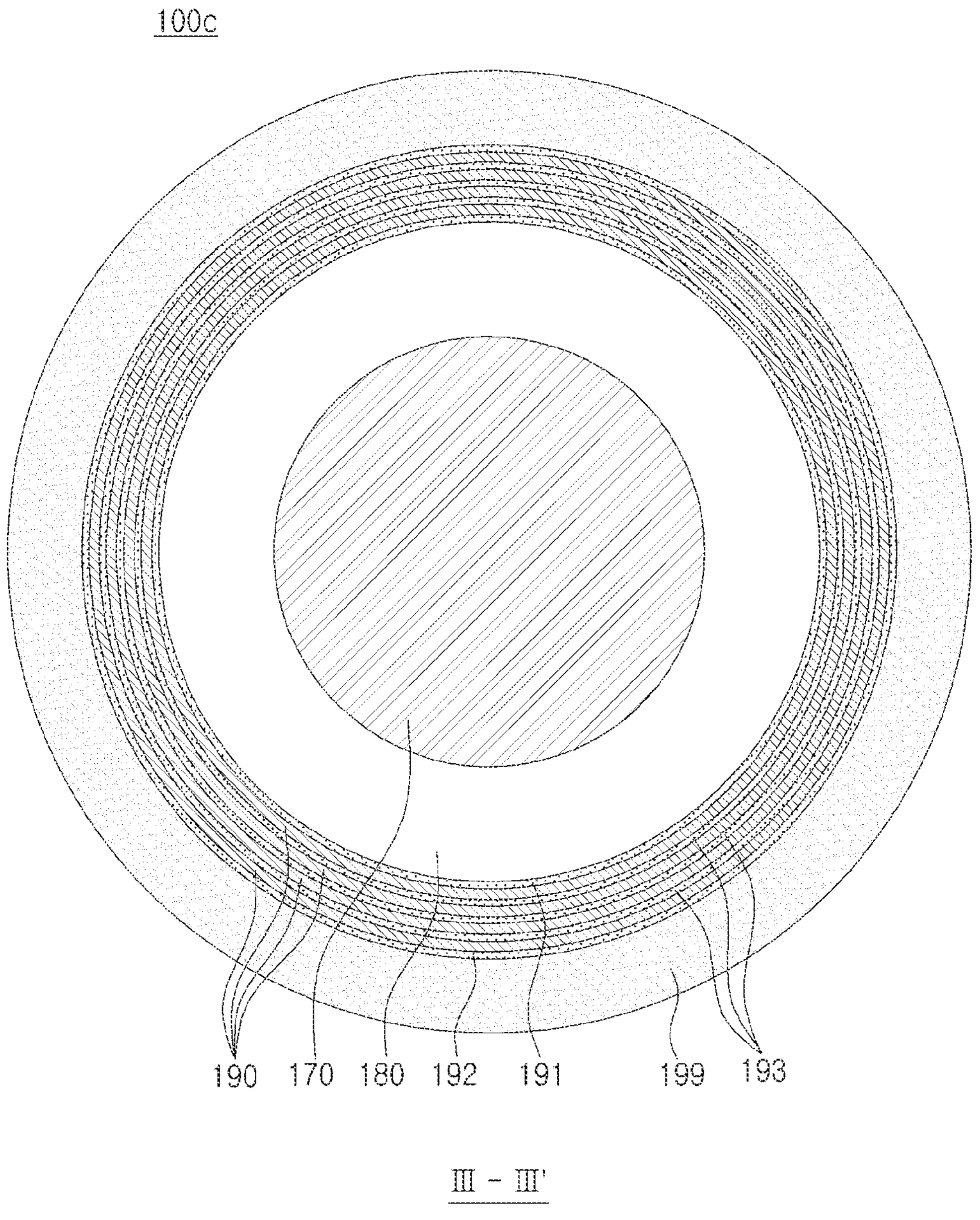

FIG. 6A is a partially enlarged view of a portion of an information storage structure of a semiconductor device according to an example embodiment, and FIG. 6B is a cross-sectional view of an information storage structure of a semiconductor device 100*c* according to an example embodiment. FIG. 6A illustrates a region corresponding to region "A" of FIG. 2, and FIG. 6B illustrates a cross-section taken along a region corresponding to line III-III' of FIG. 6A.

Referring to FIGS. 6A and 6B, in addition to the semiconductor device 100 of FIG. 2, third protective material layers 193 stacked alternately with an electrode material layer 190 may further be included. Respective electrode material layers 190 may be spaced apart from each other due to the third protective material layers 193. A first protective material layer 191, a second protective material layer 192, and a third protective material layer 193 may be spaced apart from each other. Each of the electrode material layers 190 may be the same. For example, each of the electrode material layers 190 may be made of a same material. Each of the first protective material layer 191, the second protective material layer 192, and the third protective material layer 193 may be the same. For example, each of the first protective material layer 191, the second protective material layer 192, and the third protective material layer 193 may be made of a same material. However, the present inventive concept is not limited thereto, and the electrode material layers 190 may be different from each other, and the first protective material layer 191, the second protective material layer 192, and the third protective material layer 193 may be different from each other. According to an example embodiment, a thickness of the first protective material layer 191, a thickness of the second protective material layer 192, and a thickness of each of the third protective material layers 193 may be the same, but the present inventive concept is limited thereto. A thickness of each of the electrode material layers 190 may be greater than that of each of the first, second, and third protective material layers 191, 192, and 193. According to an example embodiment, among the first protective material layer 191, the second protective material layer 192, the electrode material layers 190, and the third protective material layer 193, a lowermost layer may be the first protective material layer 191 and an uppermost layer may be the third protective material layer 193. The number, thickness and/or arrangement of the third protective material layers 193 are not limited to those illustrated, and may be changed in various manners in some example embodiments.

On a level of line III-III' of FIG. 6A, the information storage structure may include a first electrode structure 170, a dielectric layer 180 surrounding an external surface of the first electrode structure 170, a first protective material layer 191 surrounding an external surface of the dielectric layer 180, an electrode material layer 190 surrounding an external surface of the first protective material layer 191, third protective material layers 193 surrounding an external surface of the electrode material layer 190, a second protective material layer 192 surrounding an external surface of the electrode material layer 190, and a plate electrode 199 surrounding an external surface of the second protective material layer 192. The electrode material layer 190 and the third protective material layers 193 may be alternately disposed to surround each other's external surfaces. A material of each of the third protective material layers 193 may be the same as a material of the first protective material layer 191 and a material of the second protective material layer 192, but the present inventive concept is not limited thereto. According to an example embodiment, the third protective material layers 193 may include a metal-semiconductor compound. For example, each of the third protective material layers 193 may include titanium (Ti), silicon (Si), oxygen (O), and may also include nitrogen (N).

In an embodiment, the third protective material layers 193 include silicon, such that structure analysis using TEM-EELS may be performed to verify whether the third protective material layers 193 are present. In addition, the presence or absence of silicon may be verified by ToF-SIMS to verify whether the third protective material layers 193 are present.

Figure 7A:
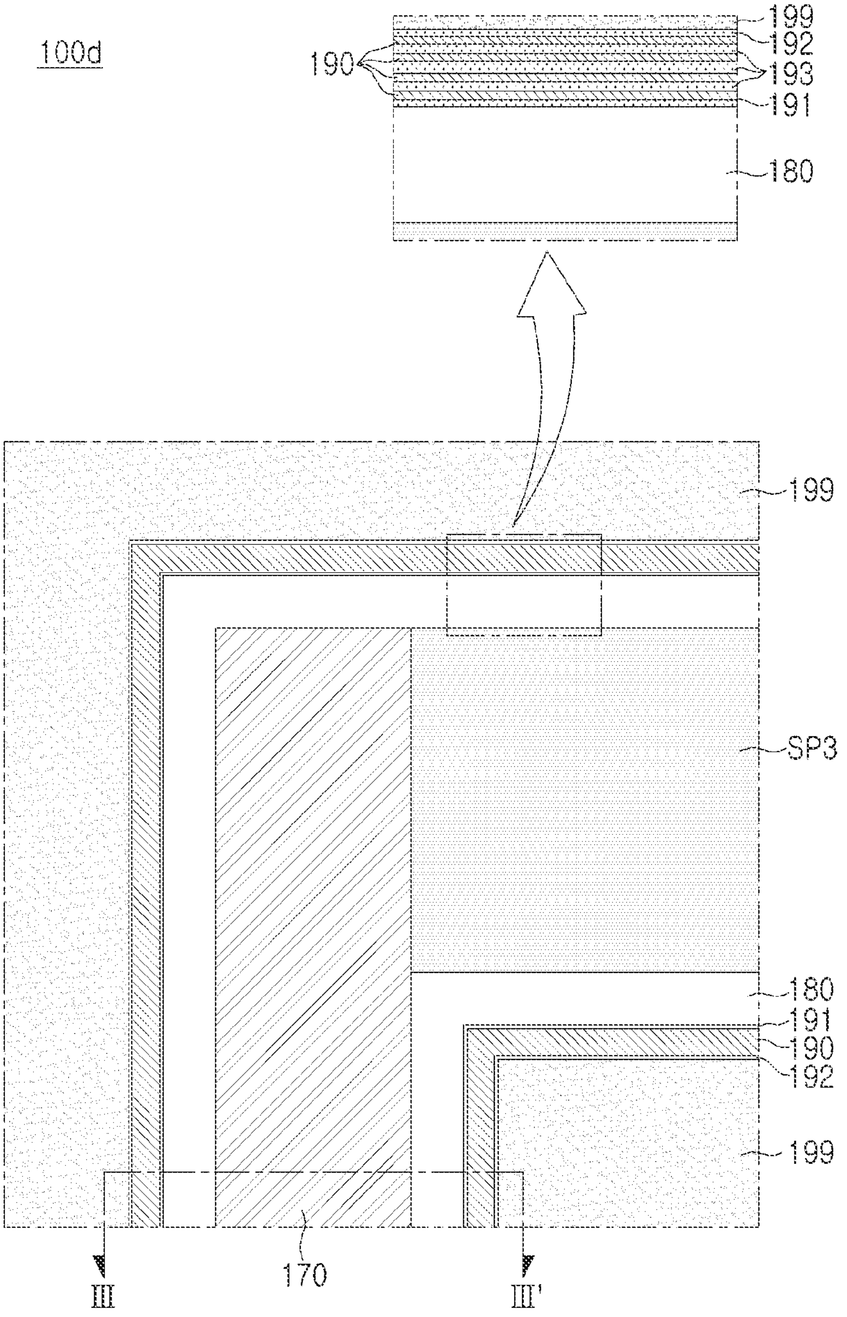
Figure 7B:
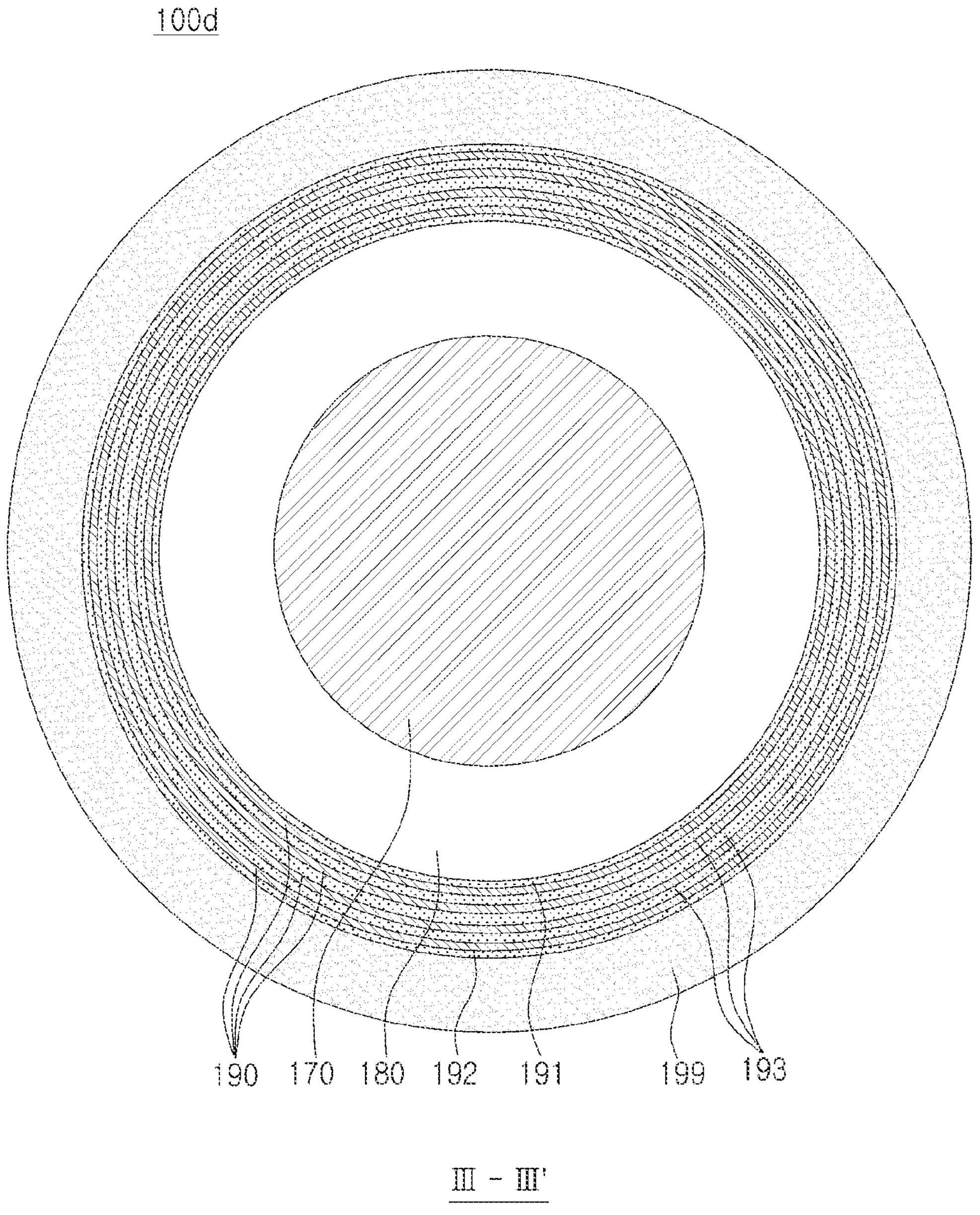

FIG. 7A is a partially enlarged view of a portion of an information storage structure of a semiconductor device according to an example embodiment, and FIG. 7B is a cross-sectional view of an information storage structure of a semiconductor device 100*d* according to an example embodiment. FIG. 7A illustrates a region corresponding to region "A" of FIG. 2, and FIG. 7B illustrates a cross-section taken along a region corresponding to line III-III' of FIG. 7A.

Referring to FIGS. 7A and 7B, in addition to the semiconductor device 100 of FIG. 2, third protective material layers 193 stacked alternately with an electrode material layer 190 may be further included. According to an example embodiment, a thickness of each of the third protective material layers 193 increase from the first protective material layer 191 to the second protective material layer 192 and then decrease, but the present inventive concept is not limited thereto. According to another example embodiment, the thickness of each of the third protective material layers 193 may continuously increase from the first protective material layer 191 to the second protective material layer 192. According to another example embodiment, the thickness of each of the third protective material layers 193 may continuously decrease from the first protective material layer 191 to the second protective material layer 192. According to another example embodiment, the thickness of each of the third protective material layers 193 may decrease and then increase from the first protective material layer 191 to the second protective material layer 192. According to an example embodiment, a thickness of the first protective material layer 191, a thickness of the second protective material layer 192, and the thickness of each of the third protective material layers 193 may be different from each other, but the present inventive concept is not limited thereto.

On a level of line III-III' of FIG. 7A, the information storage structure may include a first electrode structure 170, a dielectric layer 180 surrounding an external surface of the first electrode structure 170, a first protective material layer 191 surrounding an external surface of the dielectric layer 180, an electrode material layer 190 surrounding an external surface of the first protective material layer 191, third protective material layers 193 surrounding an external surface of the electrode material layer 190, a second protective material layer 192 surrounding an external surface of the electrode material layer 190, and a plate electrode 199 surrounding an external surface of the second protective material layer 192. For example, the dielectric layer 180 may contact an outer surface of the first electrode structure 170. The electrode material layer 190 and the third protective material layers 193 may be alternately disposed to surround each other's external surfaces.

Figure 8:
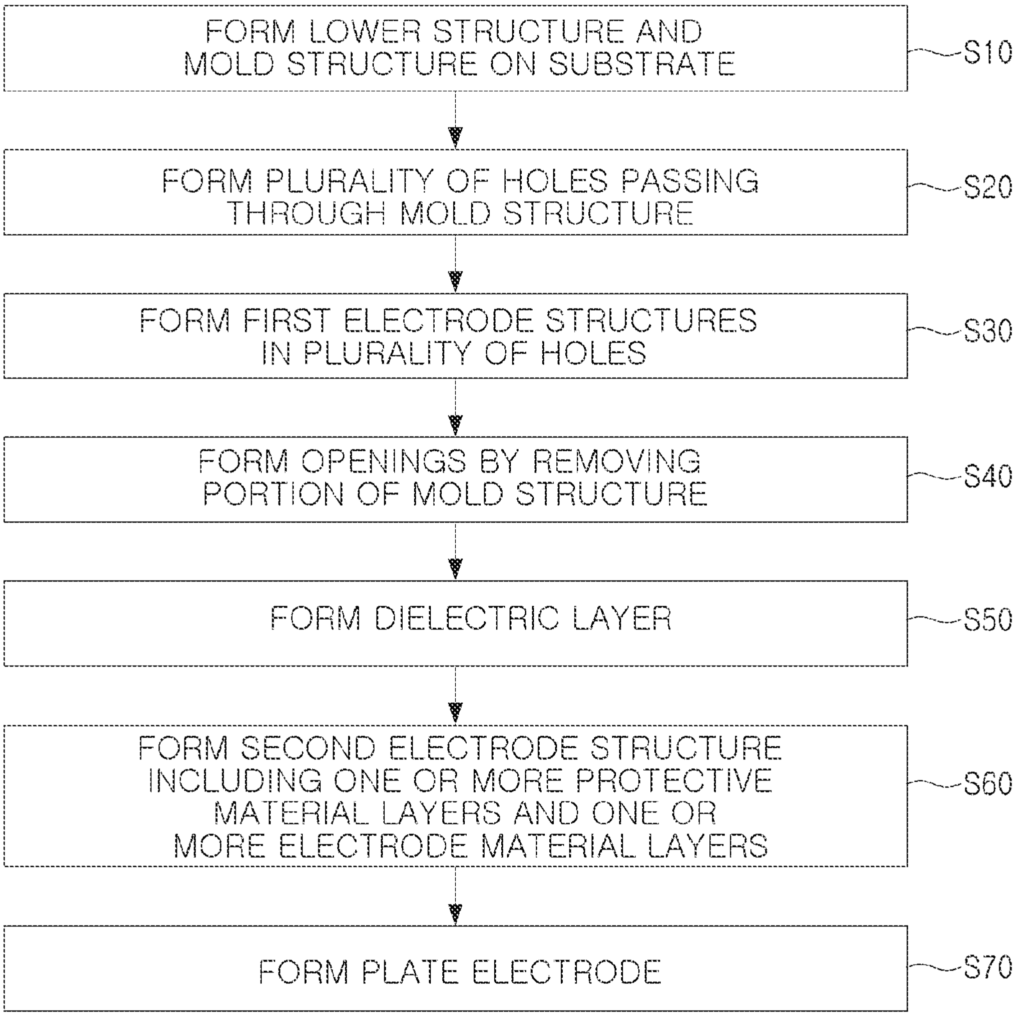
FIG. 8 is a flowchart illustrating a method of manufacturing a semiconductor device according to an example embodiment.

FIG. 8 is a flowchart illustrating a method of manufacturing a semiconductor device according to an example embodiment.

FIGS. 9A, 9B, 9C, 9D, 9E and 9F are schematic cross-sectional views illustrating a method of manufacturing a semiconductor device according to an example embodiment. FIGS. 9A, 9B, 9C, 9D, 9E and 9F describe an example embodiment of a manufacturing method for manufacturing the semiconductor device 100 of FIG. 2 and illustrate cross-sections corresponding to I-I' and II-II' of FIG. 2.

Figure 9A:
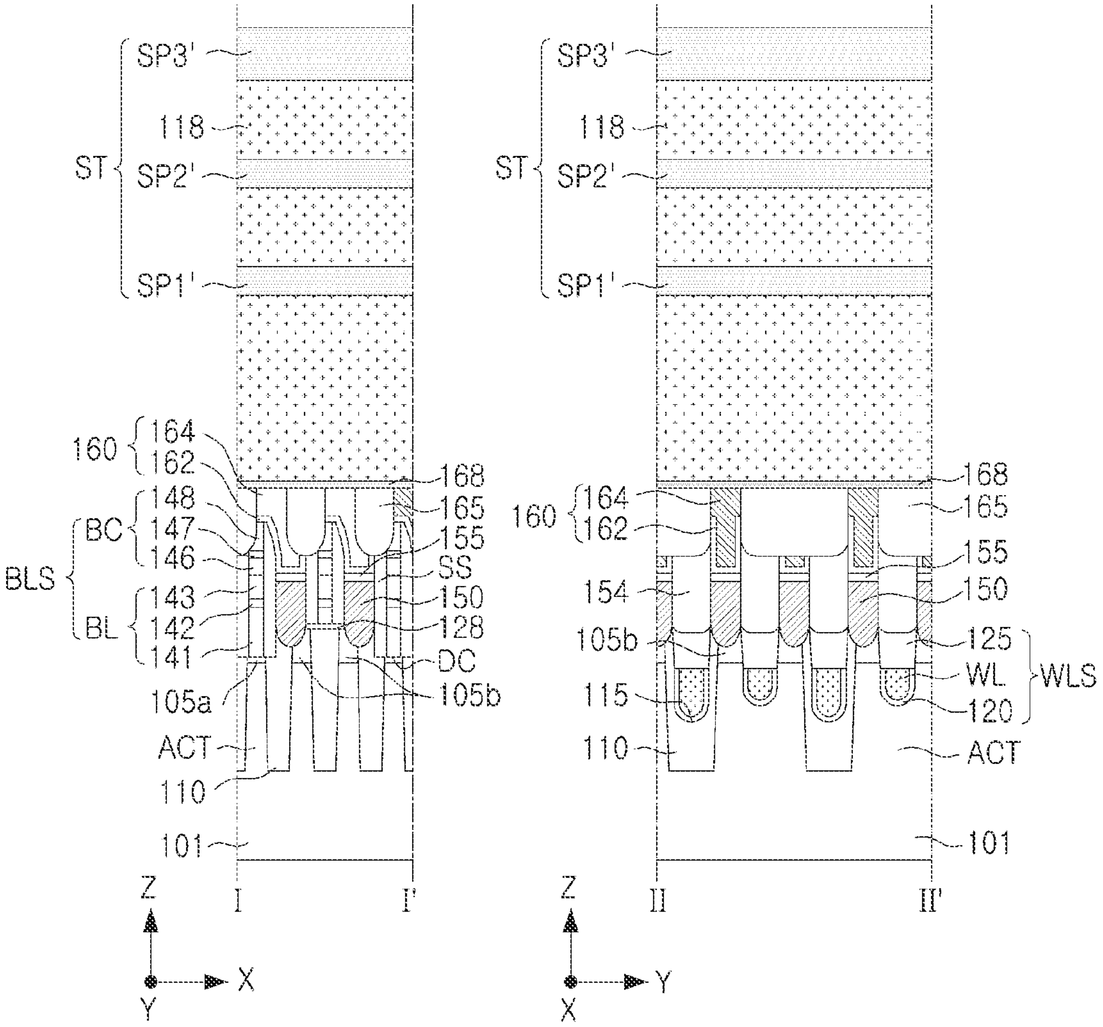
FIGS. 9A, 9B, 9C, 9D, 9E and 9F are schematic cross-sectional views illustrating a method of manufacturing a semiconductor device according to an example embodiment.

Referring to FIGS. 8 and 9A, a lower structure and a mold structure ST are formed on a substrate 101 (S10).

An isolation layer 110 may be formed on the lower substrate 101 to define an active region ACT. An isolation trench may be formed in the substrate 101, and the isolation layer 110 may fill the isolation trench. In a plan view, the active region ACT may have an elongated bar shape extending in a direction, oblique to an extension direction of a word line WL. Impurity regions may be formed on an upper portion of the active region ACT by performing an ion implantation process using the isolation layer 110 as an ion implantation mask. The active region ACT and the isolation layer 110 may be patterned to form the gate trench 115. A pair of gate trenches 115 may cross the active region ACT, but present inventive concept is not limited thereto. The impurity regions may also be isolated from each other by the gate trench 115 to form a first impurity region 105*a* and a second impurity region 105*b*.

A gate dielectric layer 120 may be formed on an internal surface of the gate trench 115 to have a substantially conformal or uniform thickness. Subsequently, the word line WL may be formed to fill at least a portion of the gate trench 115. In an embodiment, an upper surface of the word line WL is recessed to be lower than an upper surface of the active region ACT. A gate capping layer 125 may be formed on the word line WL by stacking an insulating layer on the substrate 101 to fill the gate trench 115, and etching the insulating layer.

An insulating layer and a conductive layer may be sequentially formed and patterned on a front surface of the substrate 101 to form a buffer insulating layer 128 and a first conductive pattern 141 sequentially stacked. The buffer insulating layer 128 may be formed of at least one of silicon oxide, silicon nitride, and silicon oxynitride. A plurality of buffer insulating layers 128 may be formed to be spaced apart from each other. In an embodiment, the first conductive pattern 141 has a shape corresponding to a planar shape of the buffer insulating layer 128. The buffer insulating layer 128 may be formed to simultaneously cover ends of two adjacent active regions ACT, that is, adjacent second impurity regions 105*b*. A bit line contact hole may be formed by etching upper portions of the isolation layer 110, the substrate 101, and the gate capping layer 125 using the buffer insulating layer 128 and the first conductive pattern 141 as an etching mask. The bit line contact hole may expose the first impurity region 105*a*.

A bit line contact pattern DC, filling the bit line contact hole, may be formed. Forming the bit line contact pattern DC may include forming a conductive layer filling the bit line contact hole, and performing a planarization process. For example, the bit line contact pattern DC may be formed of polysilicon. After sequentially forming a second conductive pattern 142, a third conductive pattern 143, and first to third capping patterns 146, 147, and 148 on a first conductive pattern 141, the first to third conductive patterns 141, 142, and 143 may be sequentially etched using the first to third capping patterns 146, 147, and 148 as an etching mask. As a result, a bit line structure BLS, including a bit line BL including the first to third conductive patterns 141, 142, and 143 and a bit line capping pattern BC including the first to third capping patterns 146, 147, and 148, may be formed.

A spacer structure SS may be formed on side surfaces of the bit line structure BLS. The spacer structure SS may be formed of a plurality of layers. Fence insulating patterns 154 may be formed between the spacer structures SS. The fence insulating patterns 154 may include silicon nitride or silicon oxynitride. An opening, exposing the second impurity region 105*b*, may be formed by performing an anisotropic etching process using the fence insulating patterns 154 and a third capping pattern 148 as an etching mask.

A lower conductive pattern 150 may be formed on a lower portion of the opening. The lower conductive pattern 150 may be formed of a semiconductor material such as polysilicon. For example, the lower conductive pattern 150 may be formed by forming a polysilicon layer filling the opening, and then performing an etch-back process.

The metal-semiconductor compound layer 155 may be formed on the lower conductive pattern 150. The formation of the metal-semiconductor compound layer 155 may include a metal layer deposition process and a heat treatment process.

An upper conductive pattern 160 may be formed on an upper portion of the opening. Forming the upper conductive pattern 160 may include sequentially forming a barrier layer 162 and a conductive layer 164. Thereafter, a patterning process may be performed on the barrier layer 162 and the conductive layer 164 to form the insulating patterns 165 passing or penetrating therethrough. Accordingly, a lower structure, including the substrate 101, a word line structure WLS, and the bit line structure BLS, may be formed.

An etch stop layer 168 may be conformally or uniformly formed on the lower structure, and mold layers 118 and preliminary supporter layers SP1', SP2', and SP3' may be alternately stacked on the etch stop layer 168. The mold layers 118 and the preliminary supporter layers SP1', SP2', and SP3' may form the mold structure ST. The etch stop layer 168 may include the mold layers 118 and an insulating material, for example, at least one of silicon oxide, silicon nitride, silicon carbide, silicon oxycarbide, and silicon carbonitride, having an etch selectivity under a specific etch condition. The mold layers 118 may be formed of silicon oxide, and the preliminary supporter layers SP1', SP2', and SP3' may be formed of silicon nitride.

Figure 9B:
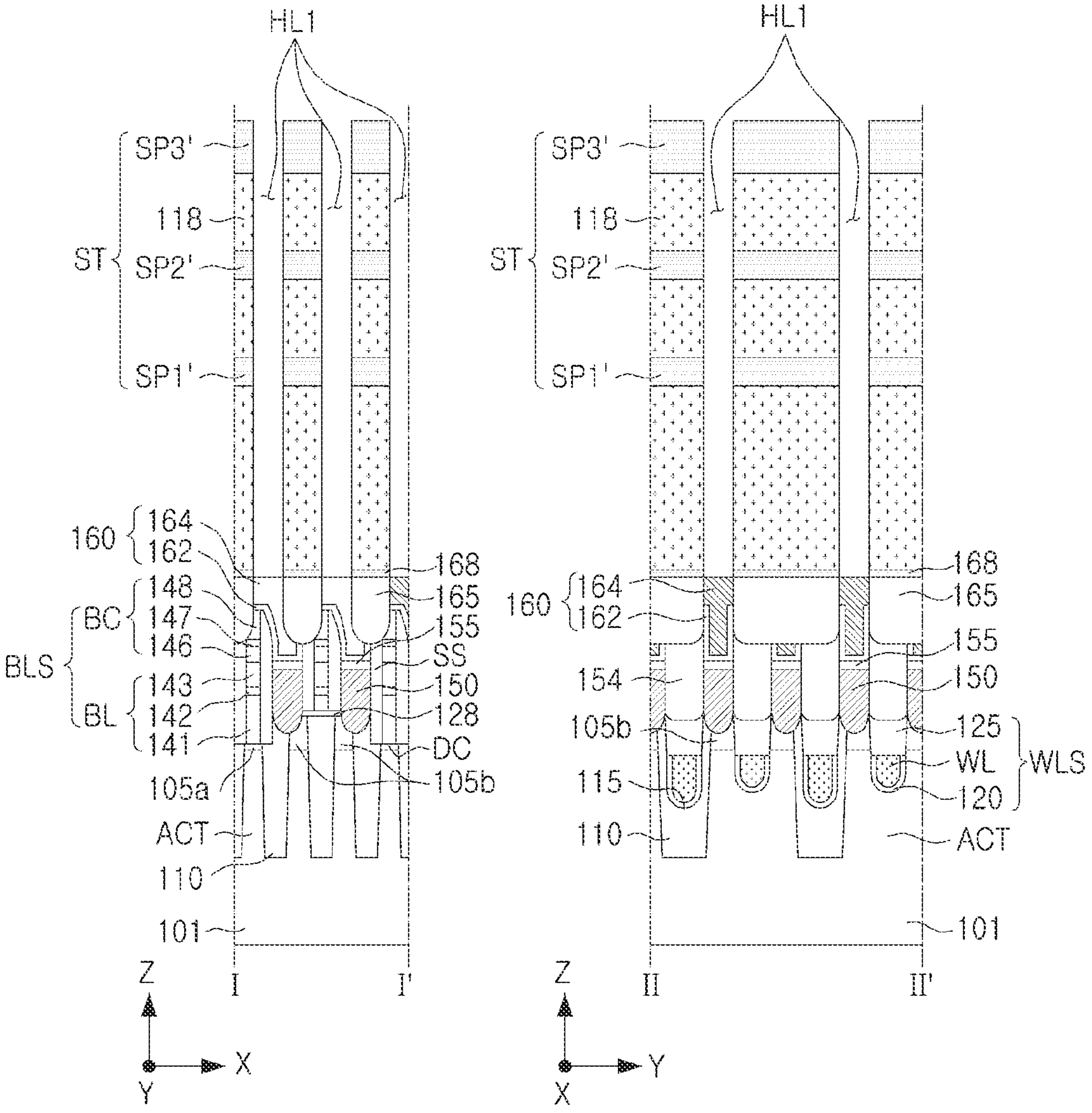

Referring to FIGS. 8 and 9B, a plurality of holes HL1 are formed passing or penetrating through the mold layers 118 and the preliminary supporter layers SP1', SP2', and SP3' (S20). For example, portions of the mold layer 118 and the preliminary supporter layers SP1', SP2', and SP3' may be removed to form the plurality of holes HL1. In an operation of forming the plurality of holes HL1, the etch stop layer 168 may serve as a stopper for stopping an etching process. The plurality of holes HL1 may pass through the etch stop layer 168 to expose upper conductive patterns 160. The plurality of holes HL1, regions in which the lower electrodes 170 are to be formed, may be spaced apart from each other at predetermined intervals on a plane so as to be formed in a regular arrangement, as illustrated in FIG. 1.

Figure 9C:
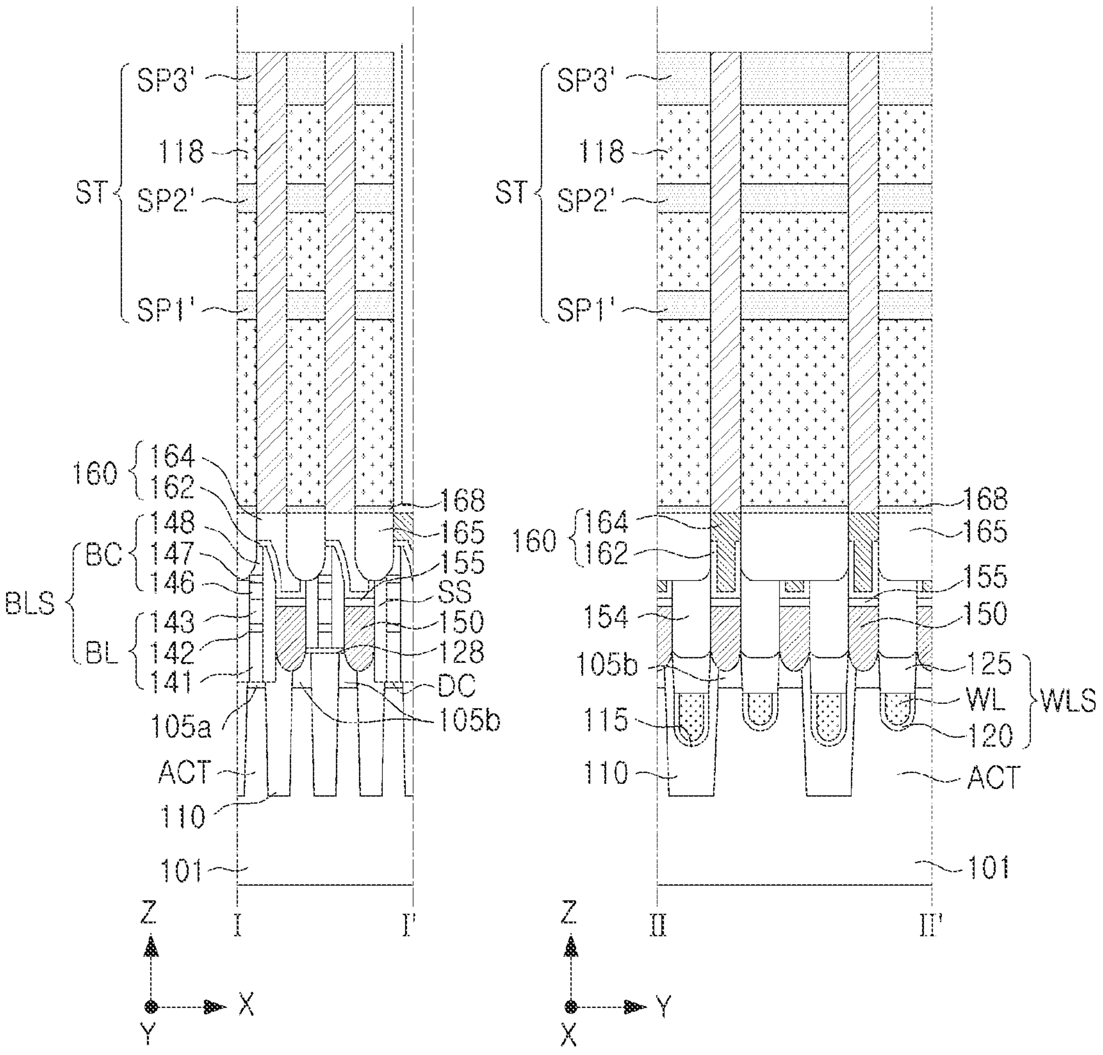

Referring to FIGS. 8 and 9C, first electrode structures 170 are formed in the plurality of hole HL1 by filling the plurality of holes HL1 with a conductive material (S30).

The first electrode structures 170 may be formed to be connected to the upper conductive pattern 160 at lower ends of the plurality of holes HL1. Forming the first electrode structures 170 may include forming a conductive material layer in the plurality of holes HL1 and on the plurality of holes HL1, and performing a planarization process, for example, a chemical mechanical polishing (CMP) process and/or an etch-back process, on the conductive material layer. Thus, the first electrode structures 170 may have a plurality of patterns spaced apart from each other by node isolation. The first electrode structures 170 may be formed of, for example, at least one of polycrystalline silicon (Si), TiN, NbN, WN, VN, MoN, TaN, TiSiN, and TiCN. In example embodiments, a process of forming the first electrode structures 170 may be performed by atomic layer deposition (ALD) or chemical vapor deposition (CVD).

Figure 9D:
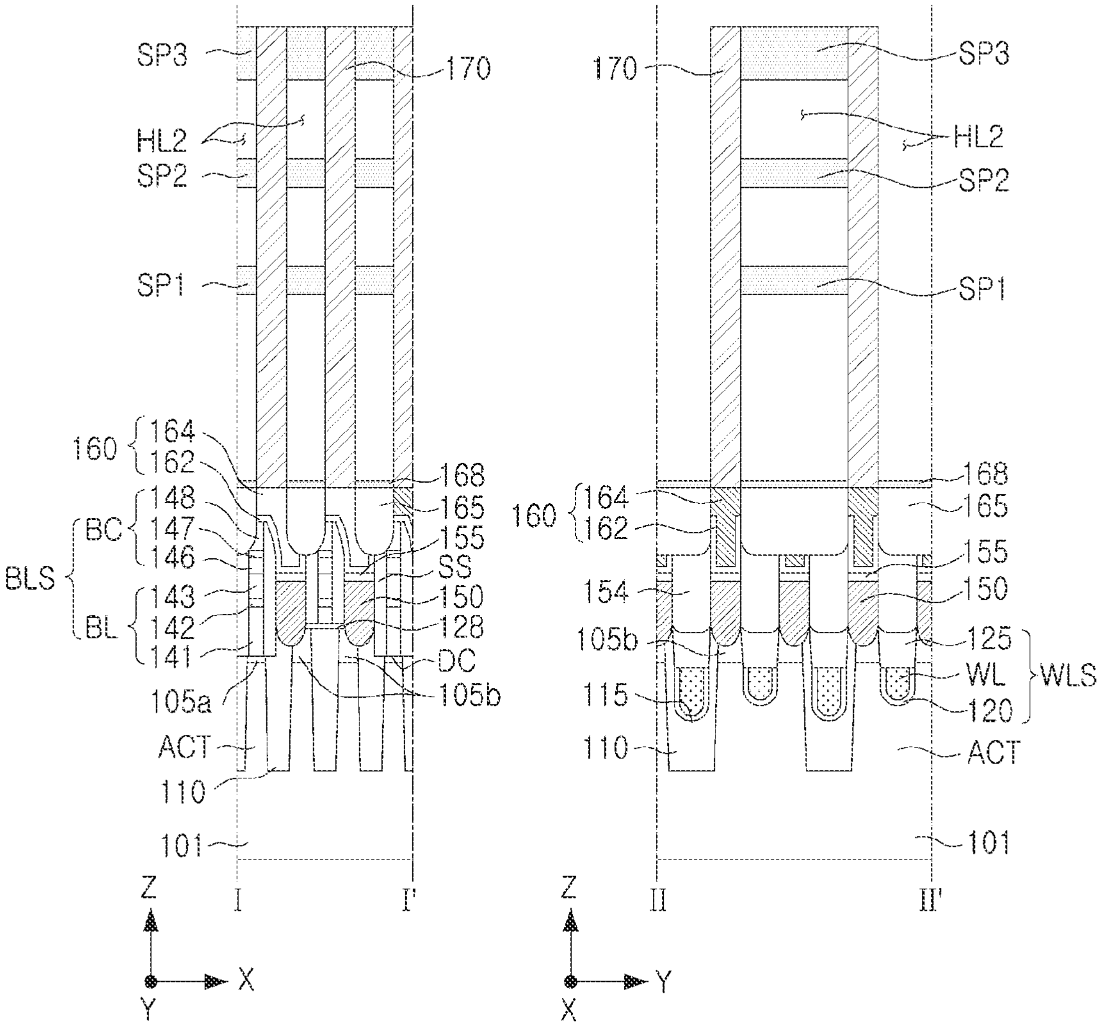

Referring to FIGS. 8 and 9D, openings HL2 may be formed by removing at least a portion of the mold structure ST, that is, at least a portion of the mold layers 118 and/or the preliminary supporter layers (SP1', SP2', and SP3' in FIG. 9E) (S40).

Thereafter, a mask may be formed on the first electrode structures 170, and at least a portion of the mold layers (118 in FIG. 9C) and the preliminary supporter layers (SP1', SP2', and SP3' in FIG. 9E) may be removed using the mask. Accordingly, the preliminary supporter layers (SP1', SP2', and SP3' in FIG. 9C) may be formed of the first to third supporter layers SP1, SP2, and SP3. The first to third supporter layers SP1, SP2, and SP3 may be patterned depending on a structure of the mask to include a plurality of openings. As illustrated in FIG. 1, the plurality of openings may be disposed between four adjacent first electrode structures 170. The first to third supporter layers SP1, SP2, and SP3 may connect adjacent first electrode structures 170 to each other. The mold layers 118 may be selectively removed with respect to the supporter layers SP1, SP2, and SP3. In an example embodiment, a process of removing the mold layers 118 is performed by a wet etching process using an etchant (for example, a hydrogen fluoride (HF) solution). The mask may be removed after the mold layers 118 are etched or while the mold layers 118 are being etched. The openings HL2 may be formed in regions in which the mold layers 118 are removed.

Figure 9E:
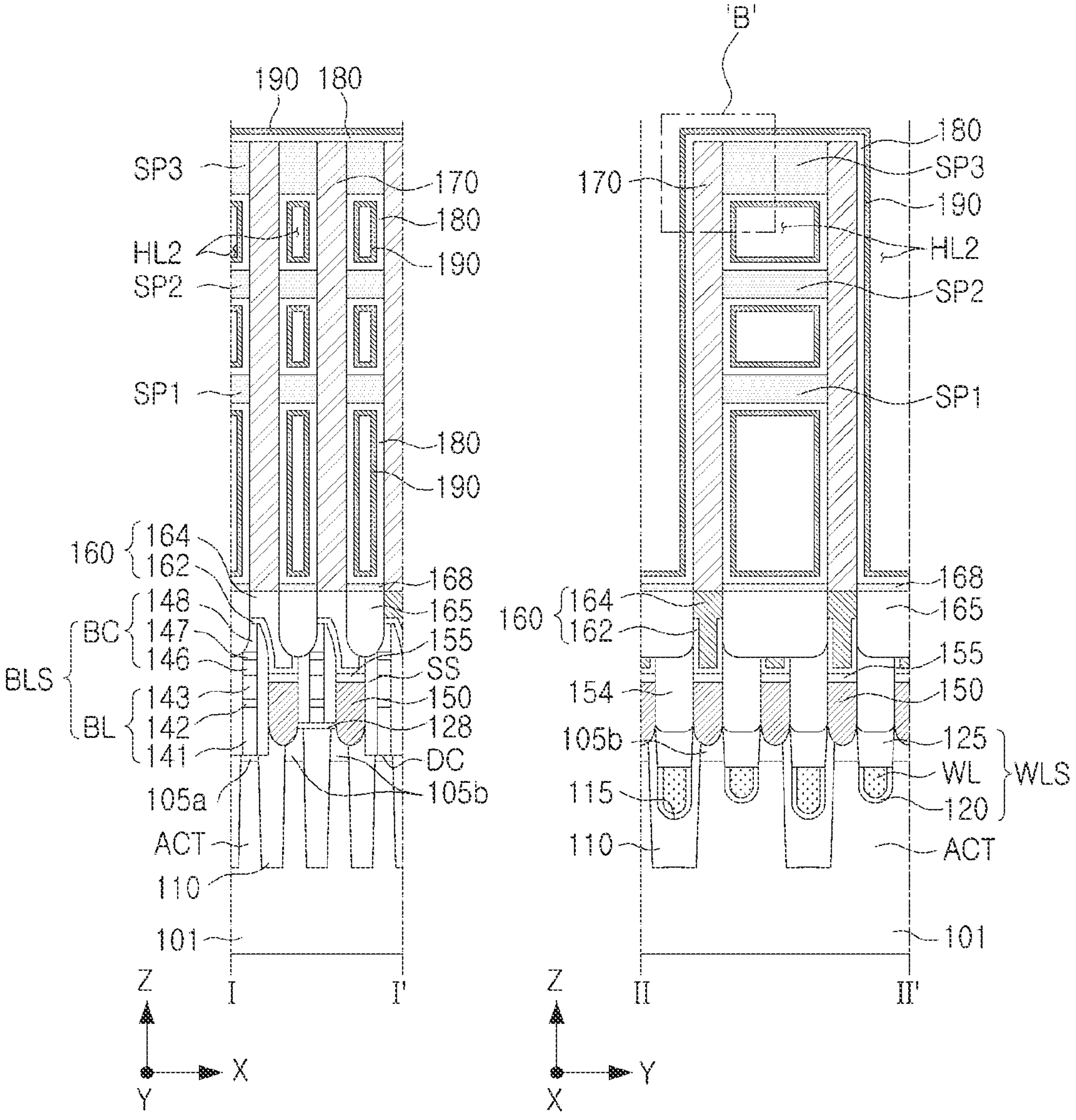
Figure 9F:
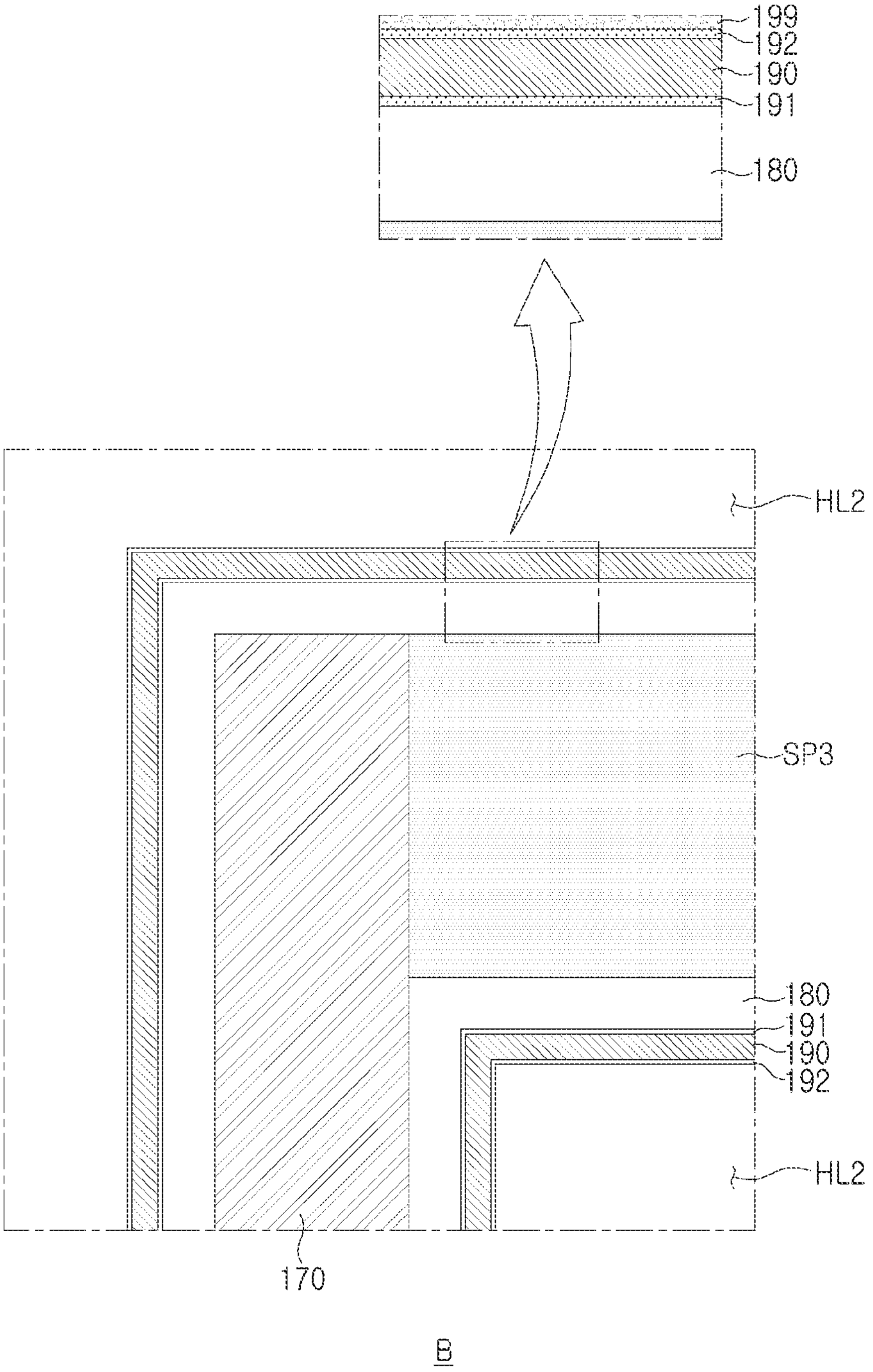

Referring to FIGS. 8, 9E, and 9F, a dielectric layer 180, covering the first electrode structures 170 in the openings HL2, and second electrode structures 190, 191, and 192, including one or more protective material layers 191 and 192 and one or more electrode material layers 190, may be formed (S50 and S60). For example, the dielectric layer 180 is formed, the first protective material layer 191 is formed on the dielectric layer 180, the electrode structure 190 is formed on the first protective material layer 191, and the second protective material layer 192 is formed on the electrode structure 190.

First, the dielectric layer 180 may be formed on the first electrode structures 170 and the first to third supporter layers SP1, SP2, and SP3 (S50). A process of forming the dielectric layer 180 may be performed by ALD or CVD.

The second electrode structures 190, 191, and 192, including the one or more protective material layers 191 and 192 and the one or more electrode material layers 190, may be formed (S60).

The one or more electrode material layers 190 may be formed of a first material, and the one or more protective material layers 191 and 192 may be formed of at least one of a second material and a third material.

Forming the one or more electrode material layers 190 as the first material may include forming a metal nitride using a metal precursor for providing a first metal element and a process gas for nitridation.

Forming the one or more protective material layers 191 and 192 as the second material may include forming a material using a metal precursor for providing a first metal element and a Group 14 element precursor for providing a Group 14 element, and oxidizing the material. For example, the second material may be a TiSiO material.

Forming the one or more protective material layers 191 and 192 as the third material may include forming a material using a metal precursor for providing a first metal element, a Group 14 element precursor for providing a Group 14 element, a process gas for nitridation, and oxidizing the material. For example, the third material may be a TiSiON material.

A silicon precursor may be, for example, monosilane (MS), disilane (DS), monoclosilane ($SiH_3Cl$), dichlorosilane (DCS), trichlorosilane (TCS), hexachlorosilane (HCS), or combinations thereof. According to an example embodiment, the silicon precursor may be dichlorosilane (DCS). However, such a configuration is merely an example embodiment and is not limited thereto. In some example embodiments, the silicon precursor may include other elements. The process gas for nitridation may be ammonia ($NH_3$) gas.

An electrode material layer 190 may be formed on a first protective material layer 191. A process of forming the electrode material layer 190 may be performed by ALD or CVD. According to an example embodiment, when a metal element of the electrode material layer 190 is a titanium (Ti) element, a metal element precursor for forming the electrode material layer 190 may be $TiCl_4$.

Referring back to FIGS. 1, 2, 3A, and 3B, a plate electrode 199, covering the second electrode structures 190, 191, and 192, may be formed (S70). For example, the plate electrode 199 may be formed on the electrode structure 192. A process of forming the plate electrode 199 may be performed by ALD, CVD, or physical vapor deposition (PVD). Accordingly, an information storage structure CAP, including the first electrode structures 170, the dielectric layer 180, the electrode material layer 190, the first protective material layer 191, and a second protective material layer 192, may be formed, thereby manufacturing the semiconductor device 100 including the information storage structure CAP.

Figure 10:
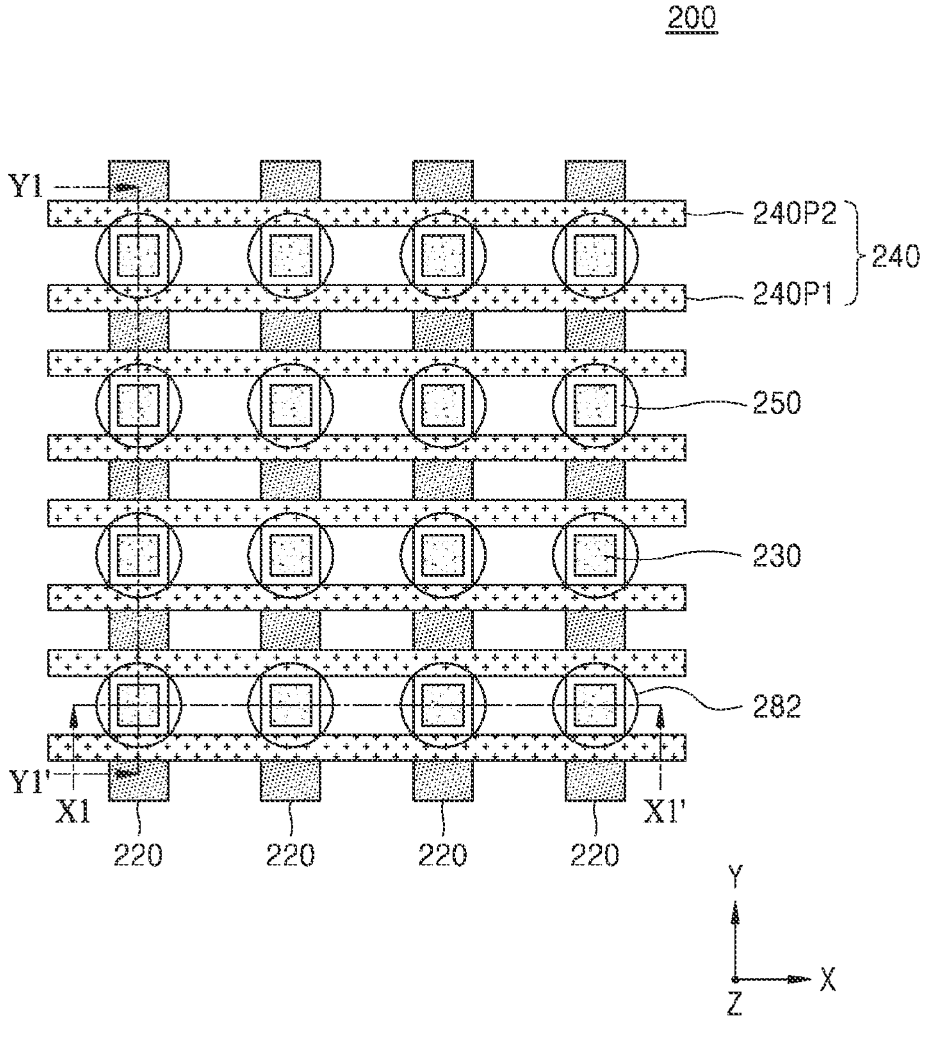
FIG. 10 is a layout diagram illustrating an integrated circuit device according to an example embodiment.

FIG. 10 is a layout diagram illustrating an integrated circuit device according to an example embodiment.

Figure 11:
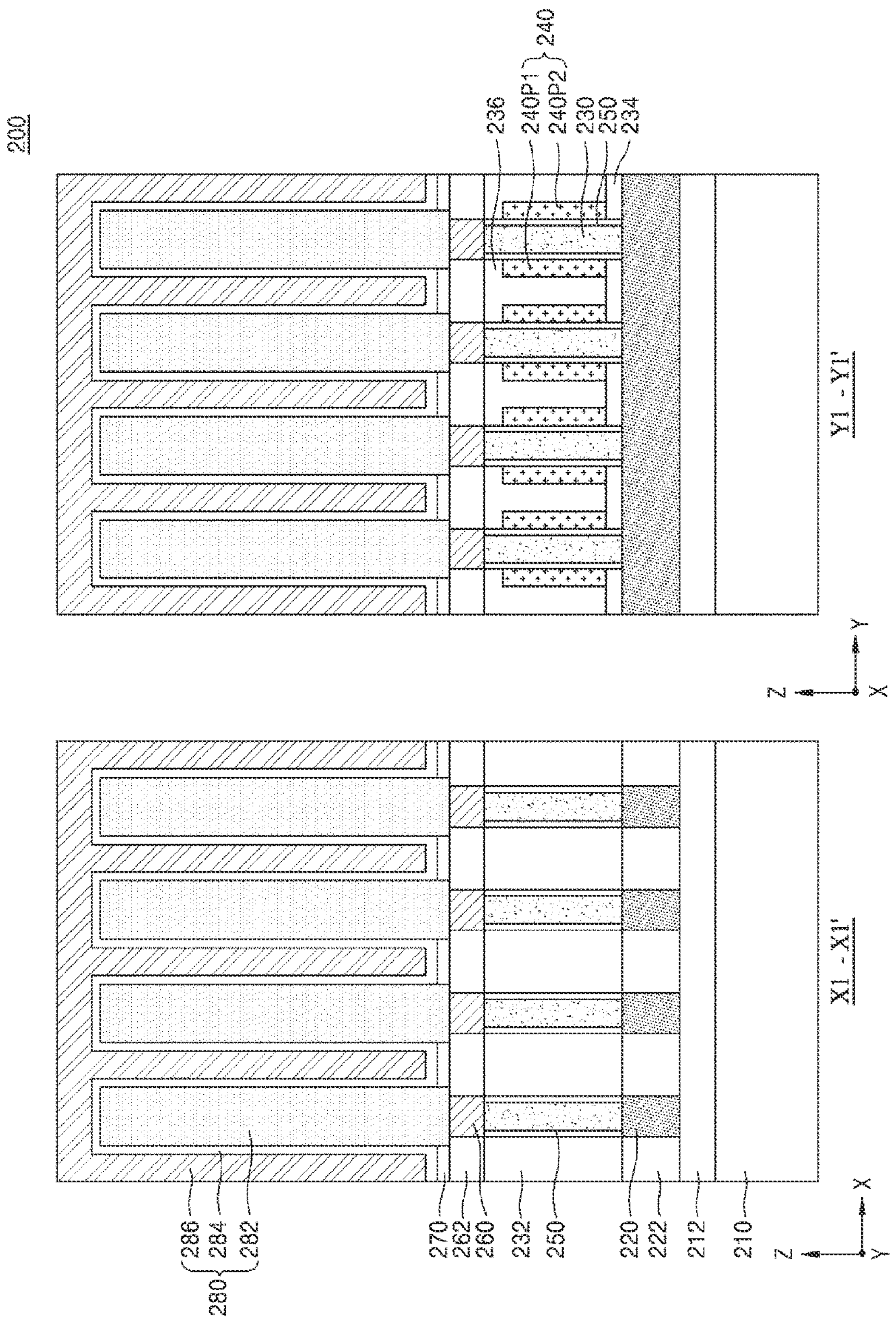
FIG. 11 is a cross-sectional view of an integrated circuit device according to an example embodiment.

FIG. 11 is a cross-sectional view of an integrated circuit device according to example embodiments. FIG. 11 is a cross-sectional view taken along lines X1-X1' and Y1-Y1' of FIG. 10.

Referring to FIGS. 10 and 11, an integrated circuit device 200 may include a substrate 210, a plurality of first conductive lines 220, a channel layer 230, a gate electrode 240, a gate insulating layer 250, and an information storage structure 280. The integrated circuit device 200 may be a memory device including a vertical channel transistor (VCT). The vertical channel transistor may refer to a structure in which a channel length of the channel layer 230 extends from the substrate 210 in a vertical direction.

A lower insulating layer 212 may be disposed on the substrate 210. For example, the lower insulating layer 212 may contact the substrate 210. On the lower insulating layer 212, the plurality of first conductive lines 220 may be spaced apart from each other in a first direction (X-direction) and may extend in a second direction (Y-direction). A plurality of first insulating patterns 222 may be disposed on the lower insulating layer 212 to fill a space between the plurality of first conductive lines 220. The plurality of first insulating patterns 222 may extend in the second direction (Y-direction). In an embodiment, upper surfaces of the plurality of first insulating patterns 222 are disposed on a level the same as that of each of upper surfaces of the plurality of first conductive lines 220. The plurality of first conductive lines 220 may function as bit lines of the integrated circuit device 200.

In example embodiments, the plurality of first conductive lines 220 may include doped polysilicon, a metal, a conductive metal nitride, a conductive metal silicide, a conductive metal oxide, or combinations thereof. For example, the plurality of first conductive lines 220 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or combinations thereof, but the present inventive concept is not limited thereto. The plurality of first conductive lines 220 may include a single layer or multiple layers formed of the above-described materials. In an example embodiment, the plurality of first conductive lines 220 may include a two-dimensional (2D) semiconductor material. For example, the 2D semiconductor material may include graphene, carbon nanotubes, or a combination thereof.

The channel layer 230 may be arranged on the plurality of first conductive lines 220 in a matrix form of being spaced apart from each other in the first direction (X-direction) and the second direction (Y-direction). In an embodiment, the channel layer 230 has a first width in the first direction (X-direction) and a first height in a third direction (Z-direction), and the first height is greater than the first width. For example, the first height may be about 2 to 10 times the first width, but the present inventive concept is not limited thereto. A bottom portion of the channel layer 230 may function as a first source/drain region (not illustrated), an upper portion of the channel layer 230 may function as a second source/drain region (not illustrated), and a portion of the channel layer 230 between the first and second source/drain regions may function as a channel region (not illustrated). The first source/drain region and the second source/drain region may be vertically spaced apart from each other, and the channel region may be a vertical channel region.

In example embodiments, the channel layer 230 may include an oxide semiconductor. For example, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or combinations thereof. The channel layer 230 may include a single layer or multiple layers of the oxide semiconductor. In an embodiment, the channel layer 230 has a bandgap energy greater than that of silicon. For example, the channel layer 230 may have a bandgap energy of about 1.5 eV to about 5.6 eV. For example, the channel layer 230 may have optimal channel performance when the channel layer 230 has a bandgap energy of about 2.0 eV to 4.0 eV. For example, the channel layer 230 may be polycrystalline or amorphous, but the present inventive concept is not limited thereto. In an example embodiment, the channel layer 230 includes a 2D semiconductor material. For example, the 2D semiconductor material may include graphene, carbon nanotubes, or a combination thereof.

The gate electrode 240 may extend on opposite sidewalls of the channel layer 230 in the first direction (X-direction). In an embodiment, the gate electrode 240 includes a first sub-gate electrode 240P1 opposing a first sidewall of the channel layer 230 and a second sub-gate electrode 240P2 opposing a second sidewall opposite to the first sidewall of the channel layer 230. Since one channel layer 230 is disposed between the first sub-gate electrode 240P1 and the second sub-gate electrode 240P2, the integrated circuit device 200 may have a dual-gate transistor structure. However, the present inventive concept is not limited thereto, and the second sub-gate electrode 240P2 may be omitted. For example, in single gate transistor structure, only the first sub-gate electrode 240P1 is present opposing the first sidewall of the channel layer 230.

The gate electrode 240 may include doped polysilicon, a metal, a conductive metal nitride, a conductive metal silicide, a conductive metal oxide, or combinations thereof. For example, the gate electrode 240 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$ or combinations thereof, but the present inventive concept is not limited thereto.

The gate insulating layer 250 may surround a sidewall of the channel layer 230 and may be interposed between the channel layer 230 and the gate electrode 240. For example, as illustrated in FIG. 11, the entire sidewall of the channel layer 230 may be surrounded by the gate insulating layer 250, and a portion of a sidewall of the gate electrode 240 may be in contact with the gate insulating layer 250. In other example embodiments, the gate insulating layer 250 may extend in a direction of extension of the gate electrode 240 (that is, the first direction (X-direction)), and only two sidewalls opposing the gate electrode 240 among sidewalls of the channel layer 230 may be in contact with the gate insulating layer 250.

In example embodiments, the gate insulating layer 250 may be formed of a silicon oxide film, a silicon oxynitride film, a high-κ dielectric film having a dielectric constant higher than that of the silicon oxide film, or combinations thereof. The high-κ dielectric film may be formed of a metal oxide or a metal oxynitride. For example, the high-κ dielectric film usable as the gate insulating layer 250 may be formed of $HfO_2$, HfSiO, HfSiON, HfTaO, HfTiO, HfZrO, $ZrO_2$, $Al_2O_3$, or combinations thereof, but the present inventive concept is not limited thereto.

A plurality of second insulating patterns 232 may extend from the plurality of first insulating patterns 222 in the second direction (Y-direction), and the channel layer 230 may be disposed between two adjacent second insulating patterns 232 among the plurality of second insulating patterns 232. In addition, between the two adjacent second insulating patterns 232, a first buried layer 234 and a second buried layer 236 may be disposed in a space between two adjacent channel layers 230. The first buried layer 234 may be disposed on a bottom portion of the space between the two adjacent channel layers 230, and the second buried layer 236 may be disposed on the first buried layer 234 to fill a remainder of the space between the two adjacent channel layers 230. In an embodiment, an upper surface of the second buried layer 236 is disposed on a level the same as that of an upper surface of the channel layer 230. In an embodiment, the second buried layer 236 covers an upper surface of the gate electrode 240. Alternatively, the plurality of second insulating patterns 232 may be formed as a material layer continuous with the plurality of first insulating patterns 222, or the second buried layer 236 may be formed as a material layer continuous with the first buried layer 234. For example, a single continuous layer may form a second insulating pattern 232 and a corresponding first insulating pattern 222. For example, a single continuous layer may form a second buried layer 236 and a corresponding first buried layer 234.

A storage contact 260 may be disposed on the channel layer 230. For example, the storage contact 260 may contact the channel layer 230. The storage contact 260 may vertically overlap the channel layer 230, and may be arranged in a matrix form of being spaced apart from each other in the first direction (X-direction) and the second direction (Y-direction). The storage contact 260 may be formed of Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or combinations thereof, but the present inventive concept is not limited thereto. The upper insulating layer 262 may surround a sidewall of the storage contact 260 on the plurality of second insulating patterns 232 and the second buried layer 236.

An etch stop film 270 may be disposed on the upper insulating layer 262, and the information storage structure 280 may be disposed on the etch stop film 270. The etch stop film 270 may contact the upper insulating layer 262 and the information storage structure 280. The information storage structure 280 may include a first electrode structure 282, a dielectric layer 284, and a plate electrode 286.

The first electrode structure 282 may pass or penetrate through the etch stop film 270 to be electrically connected to an upper surface of the storage contact 260. The first electrode structure 282 may be formed as a pillar-type electrode extending in the third direction (Z-direction), but the present inventive concept is not limited thereto. In an example embodiment, the first electrode structure 282 is disposed to vertically overlap the storage contact 260, and may be arranged in a matrix form of being spaced apart from each other in the first direction (X-direction) and the second direction (Y-direction). Alternatively, a landing pad may be further disposed between the storage contact 260 and the first electrode structure 282, such that the first electrode structure 282 may be arranged to have a hexagonal shape.

In the integrated circuit device 200, the information storage structure 280 may include a first protective material layer (see "191" in FIG. 3A) disposed on the dielectric layer 284, an electrode material layer (see "190" in FIG. 3A) disposed on the first protective material layer 191, a second protective material layer (see "192" in FIG. 3A) disposed on the electrode material layer 190, and the plate electrode 286.

Figure 12:
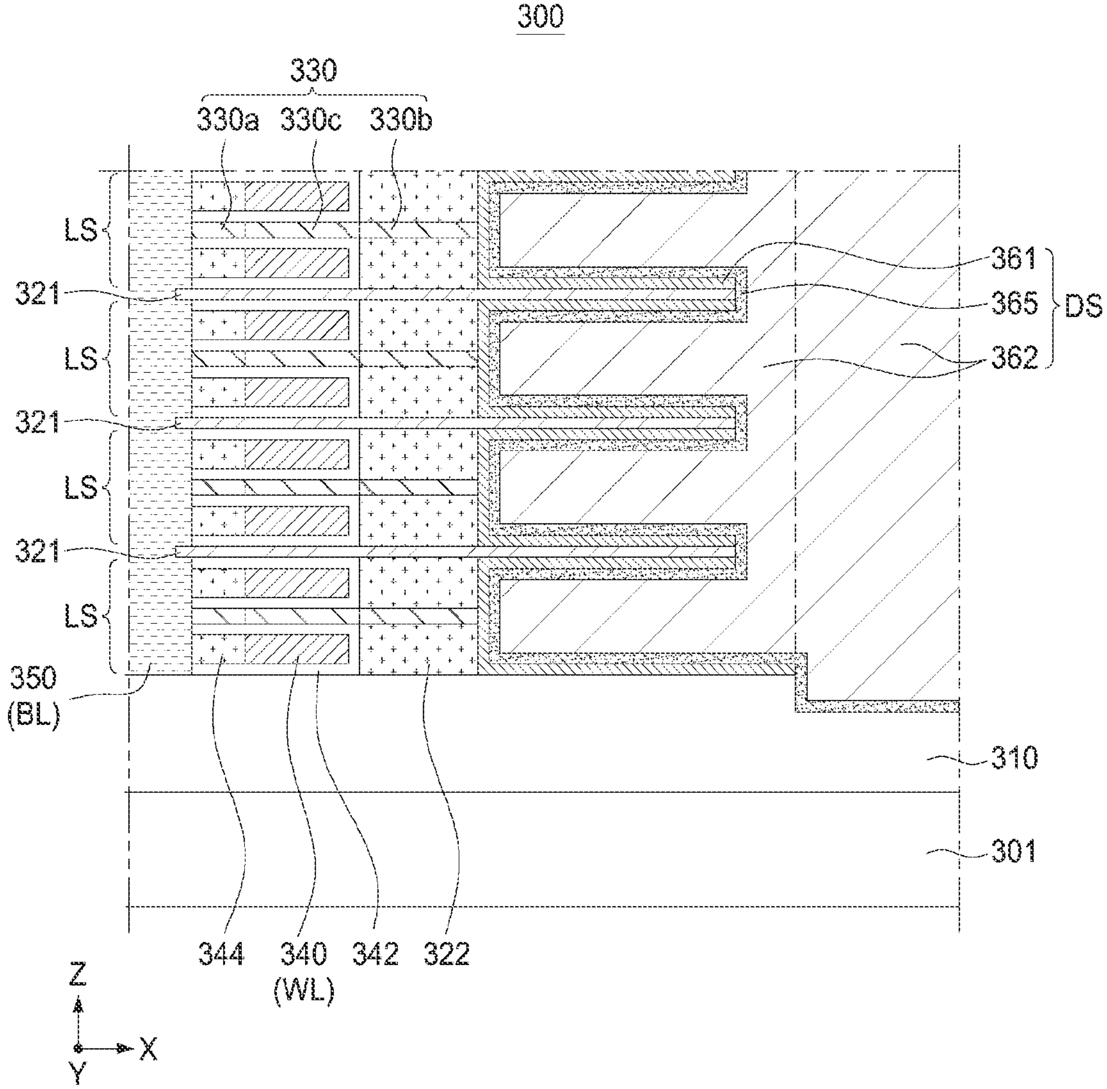
FIG. 12 is a cross-sectional view of a semiconductor device according to an example embodiment.

FIG. 12 is a cross-sectional view of a semiconductor device according to an example embodiment.

Referring to FIG. 12, a semiconductor device 300 may include a substrate 301, a lower structure 310 disposed on the substrate 301, a plurality of structures LS and a plurality of first insulating layers 321 alternately stacked on the substrate 301, and a plurality of second conductive patterns 350 spaced apart from each other. Each of the plurality of structures LS may include an active layer 330 extending in an X-direction, a first conductive pattern 340 intersecting the active layer 330 and extending in a Y-direction, perpendicular to the X-direction, a gate dielectric layer 342 disposed between the active layer 330 and the first conductive pattern 340, a gate capping layer 344 disposed between the first conductive pattern 340 and a second conductive pattern 350, a first electrode 361 of the information storage structure DS, and a second insulating layer 322 disposed between the first conductive pattern 340 and the first electrode 361. The information storage structure DS may further include a dielectric layer 365 disposed on the first electrode 361, a first protective material layer (see "191" in FIG. 3A) disposed on the dielectric layer 365, an electrode material layer (see "190" in FIG. 3A) disposed on the first protective material layer 191, a second protective material layer 192 disposed on the electrode material layer 190, and a second electrode 362 disposed on the dielectric layer 365. The X-direction and the Y-direction may be perpendicular to each other, and may be parallel to an upper surface of the substrate 301. The Z-direction may be perpendicular to the X-direction and the Y-direction, and may be perpendicular to the upper surface of the substrate 301.

The lower structure 310 may be disposed on the substrate 301. The plurality of structures LS and the plurality of first insulating layers 321 may be stacked on the lower structure 310. The lower structure 310 may include a device region on the substrate 301 and an insulating region covering the device region. The insulating region may be formed of an insulating material, for example, insulating layers including at least one of silicon oxide, silicon nitride, silicon oxynitride, and silicon oxycarbide.

The plurality of structures LS and the plurality of first insulating layers 321 may form a mold structure on the substrate 301. The plurality of structures LS may be disposed between the plurality of first insulating layers 321, and may be spaced apart from each other in the Z-direction by the plurality of first insulating layers 321. The first insulating layer 321 may extend in the X-direction, and an end portion thereof may extend into the second conductive pattern 350. For example, a portion of the first insulating layer 321 may extend into the second conductive pattern 350. The second insulating layer 322 may be disposed between the first insulating layer 321 and the active layer 330 and between the first conductive pattern 340 and the information storage structure DS. The first insulating layer 321 and the second insulating layer 322 may respectively include an insulating material, for example, at least one of silicon oxide, silicon nitride, silicon oxynitride, and silicon oxycarbide. In an embodiment, the first insulating layer 321 horizontally extends to be longer than the second insulating layer 322. In an embodiment, a thickness of the second insulating layer 322 is greater than a thickness of the first insulating layer 321. For example, the thickness of the second insulating layer 322 in the Z direction may be greater than a thickness of the first insulating layer 321 in the Z direction. The active layer 330 may be disposed on the substrate 301, and may horizontally extend in the X-direction. A plurality of active layers 330 may be stacked to be spaced apart from each other in the Z-direction, and may be arranged in the Y-direction. The plurality of active layers 330, arranged in the Z-direction, may be disposed between the plurality of first insulating layers 321. The active layer 330 may have a linear shape, a bar shape, or a pillar shape, intersecting the first conductive pattern 340 and extending in the X-direction. The active layer 330 may include a semiconductor material, for example, silicon, germanium, or silicon-germanium.

In an embodiment, the active layer 330 includes a first impurity region **330*a*, a second impurity region 330*b*, and a channel region 330*c*. The first impurity region 330*a* may be electrically connected to the second conductive pattern 350. The second impurity region 330*b* may be electrically connected to the first electrode 361 of the information storage structure DS. A length of the second impurity region 330***b* in the X-direction may be longer than a length of the first impurity region 330*a* in the X-direction, but the present inventive concept is not limited thereto. The channel region 330*c* may be disposed between the first impurity region 330*a* and the second impurity region 330*b*. In an embodiment, the channel region 330*c* overlaps the first conductive pattern 340. For example, the channel region 330*c* may overlap the first conductive pattern 340 in an X direction. In an embodiment, the first impurity region 330*a* and the second impurity region 330*b* are disposed on the same level while being spaced apart from each other in a horizontal direction or X direction, and the channel region 330*c* may be a horizontal channel region 330*c*.

The first impurity region 330*a* and the second impurity region 330*b* may be formed by performing a process of doping or ion implantation of impurities on the active layer 330. The first impurity region 330*a* and the second impurity region 330*b* may have an N-type or P-type conductivity.

A portion of the first impurity region 330*a* may correspond to a source region of the memory cell transistor MCT of FIG. 1, a portion of the second impurity region 330*b* may correspond to a drain region of the memory cell transistor MCT of FIG. 1, and the channel region 330*c* may correspond to a channel of the memory cell transistor MCT of FIG. 1. A portion of the first impurity region 330*a* may provide a first contact region for directly connecting the source region of the memory cell transistor MCT to the second conductive pattern 350, that is, the bit line BL, and a portion of the second impurity region 330*b* may provide a second contact region for directly connecting the drain region of the memory cell transistor MCT to the information storage element DSE, that is, the information storage structure DS.

In another example, active layers 330 may be formed of an oxide semiconductor, for example, at least one of hafnium-silicon oxide (HSO), hafnium-zinc oxide (HZO), indium-zinc oxide (IZO), indium-gallium oxide (IGO), indium-tin oxide (ITO), indium-gallium-zinc oxide (IGZO), and indium-tin-zinc oxide (ITZO).

In another example, the active layers 330 may include a 2D material in which atoms form a predetermined crystal structure and form a channel of a transistor. The 2D material layer may include at least one of a transition metal dichalcogenide (TMD) material layer, a black phosphorous material layer, and a hexagonal boron-nitride (hBN) material layer. For example, the 2D material layer may include at least one of BiOSe, Crl, $WSe_2$, $MoS_2$, TaS, WS, SnSe, ReS, β-SnTe, MnO, AsS, P(black), InSe, h-BN, GaSe, GaN, SrTiO, MXene, and a Janus 2D material capable of forming the 2D material.

In another example, the structure LS may further include epitaxial layers grown from the active layer 330 and respectively connected to a first region 330*a* and a second region 330*b* of the active layer 330.

The first conductive pattern 340 may be disposed on the substrate 301 and may horizontally extend in the Y-direction. A plurality of first conductive patterns 340 may be stacked to be spaced apart from each other in the Z-direction, and may be arranged in the X-direction. The first conductive pattern 340 may be disposed between the channel region 330*c* of the active layer 330 and the first insulating layer 321. The first conductive pattern 340 may be disposed on an upper surface and a lower surface of the active layer 330. The first conductive pattern 340 may have a linear shape, a bar shape, or a pillar shape, intersecting the second conductive pattern 350 and extending in the Y-direction. Although not illustrated, the plurality of first conductive patterns 340, stacked in the Z-direction in one memory cell, may extend to have different lengths in the Y-direction so as to provide a contact region in which respective upper surfaces thereof are exposed.

The first conductive pattern 340 may include a conductive material, and the conductive material may include at least one of a doped semiconductor material, a conductive metal nitride, a metal, and a metal-semiconductor compound. The first conductive pattern 340 may be the word line WL described with reference to FIG. 2, and may also be referred to as a "gate electrode."

The gate dielectric layer 342 may be disposed between the first conductive pattern 340 and the active layer 330. The gate dielectric layer 342 may be formed to have a substantially conformal or uniform thickness in an internal space of a gap region formed by etching the second insulating layer 322 from a side surface thereof, between adjacent first insulating layers 321. The gate dielectric layer 342 may include silicon oxide, silicon nitride, or a high-κ dielectric material.

The gate capping layer 344 may be disposed to fill a region of a side surface thereof from which the first conductive pattern 340 is partially removed. For example, the side surface of the gate capping layer 344 may be in contact with a side surface of the first conductive pattern 340, and upper and lower surfaces of the gate capping layer 344 may be covered by the gate dielectric layer 342. In an embodiment, the gate capping layer 344 electrically insulates the first conductive pattern 340 and the second conductive pattern 350 from each other.

The second conductive pattern 350 may vertically extend on the substrate 301 in the Z-direction. The plurality of second conductive patterns 350 may be arranged in the Y-direction. The second conductive pattern 350 may be disposed to be adjacent to the first impurity region 330*a* and a first end surface of the active layer 330. The second conductive pattern 350 may have an inclined internal surface opposing inclined side surfaces of an epitaxial layer. The plurality of active layers 330, stacked in the Z-direction, may be electrically connected to one second conductive pattern 350. The second conductive pattern 350 may have a linear shape, a bar shape, or a pillar shape extending in the Z-direction. The semiconductor device may further include an upper interconnection disposed on the second conductive pattern 350, connected to the second conductive pattern 350, and extending in the X-direction. The second conductive pattern 350 may include at least one of a doped semiconductor material, a conductive metal nitride, a metal, and a metal-semiconductor compound.

The information storage structure DS may be disposed to be adjacent to the second impurity region 330*b* and a second end surface of the active layer 330. The information storage structure DS may be electrically connected to the active layer 330. The information storage structure DS may include a first electrode 361, a dielectric layer 365 disposed on the first electrode 361, and a second electrode 362 disposed on the dielectric layer 365. The first electrode 361 of the information storage structure DS may have a cylinder shape as illustrated in FIG. 12, but the present inventive concept is not limited thereto, and may have a pillar shape in example embodiments.

The first electrode 361 may be formed to have a substantially conformal or uniform thickness in an internal space of a gap region formed by etching the second insulating layer 322 from a side surface thereof. The first electrode 361 may be in a state in which a node is isolated for each structure LS by depositing a conductive material, and then removing a portion on a side surface of the first insulating layer 321. The first electrode 361 may include at least one of a doped semiconductor material, a conductive metal nitride, a metal, and a conductive metal oxide.

The dielectric layer 365 may conformally or uniformly cover the first electrode 361. The dielectric layer 365 may cover a protruding portion of the first electrode 361, and may include a protruding portion toward the second electrode 362. The dielectric layer 365 may include a high-κ dielectric material or silicon oxide, silicon nitride, silicon oxynitride, or combinations thereof. However, in some example embodiments, the dielectric layer 365 may include an oxide, nitride, silicide, oxynitride, or silicified oxynitride including at least one of Hf, Al, Zr, and La.

The second electrode 362 may cover the dielectric layer 365. The second electrode 362 may fill an internal space of the first electrode 361 having a cylindrical shape. The second electrode 362 may include at least one of a doped semiconductor material, a conductive metal nitride, a metal, and a metal-semiconductor compound.

In the semiconductor device 300, the information storage structure DS may include a first protective material layer (see "191" in FIG. 3A) disposed on the dielectric layer 365, an electrode material layer (see "190" in FIG. 3A) disposed on the first protective material layer 191, and a second protective material layer (see "192" in FIG. 3A) disposed on the electrode material layer 190.

In a semiconductor device according to example embodiments of the present inventive concept, a first protective material layer including silicon (Si) and a second protective material layer including silicon (Si) may be disposed on an electrode material layer, thereby preventing the resistance of the electrode material layer from being reduced to secure the capacitance of a capacitor. However, the present inventive concept is not limited to such effects.

While example embodiments have been illustrated and described above, it will be apparent to those skilled in the art that modifications and variations could be made without departing from the scope of the present inventive concept.

What is claimed is:

1. A semiconductor device comprising:
a conductive pattern; and
a capacitor electrically connected to the conductive pattern,
wherein the capacitor comprises:
a first electrode structure electrically connected to the conductive pattern;
a dielectric layer disposed on the first electrode structure;
a second electrode structure disposed on the dielectric layer; and
a plate electrode disposed on the second electrode structure,
wherein the second electrode structure comprises:
a first electrode material layer including a first metal element and a nitrogen element; and
a first protective material layer including a second metal element, a Group 14 element, and an oxygen element,
wherein the first metal element and the second metal element are a same element.

2. The semiconductor device of claim 1, wherein
the Group 14 element is Silicon (Si).

3. The semiconductor device of claim 2, wherein the first metal element and the second metal element include at least one of Titanium (Ti), Chromium (Cr), Niobium (Nb), Hafnium (Hf), and Zirconium (Zr).

4. The semiconductor device of claim 1, wherein the first protective material layer further includes a nitrogen element.

5. The semiconductor device of claim 1, wherein a thickness of the first electrode material layer is greater than a thickness of the first protective material layer.

6. The semiconductor device of claim 1, wherein the first electrode material layer is disposed between the dielectric layer and the first protective material layer.

7. The semiconductor device of claim 6, wherein the first protective material layer is disposed between the first electrode material layer and the plate electrode.

8. The semiconductor device of claim 1, wherein the second electrode structure further comprises:
a second protective material layer,
the first protective material layer is disposed between the first electrode material layer and the dielectric layer,
the first electrode material layer is disposed between the first protective material layer and the second protective material layer, and
a thickness of the first electrode material layer is greater than a thickness of each of the first and second protective material layers.

9. The semiconductor device of claim 8, wherein the second protective material layer is disposed between the first electrode material layer and the plate electrode.

10. The semiconductor device of claim 9, wherein a material of the second protective material layer is the same as a material of the first protective material layer.

11. The semiconductor device of claim 9, wherein a material of the second protective material layer is different from a material of the first protective material layer and a material of the first electrode material layer.

12. The semiconductor device of claim 1, wherein the second electrode structure further comprises:
a second electrode material layer; and
a second protective material layer,
the first electrode material layer and the second electrode material layer are spaced apart from each other, and
the first protective material layer and the second protective material layer are spaced apart from each other.

13. The semiconductor device of claim 12, wherein
a material of the first electrode material layer is the same as a material of the second electrode material layer, and
a material of the first protective material layer is the same as a material of the second protective material layer.

14. The semiconductor device of claim 12, wherein
a material of the first electrode material layer is different from a material of the second electrode material layer, and
a material of the first protective material layer is different from a material of the second protective material layer.

15. The semiconductor device of claim 12, wherein the second electrode structure further comprises:
a third protective material layer,
a thickness of each of the first and second electrode material layers is greater than a thickness of each of the first, second and third protective material layers,
the first protective material layer, the second protective material layer, and the third protective material layer are spaced apart from each other,
the first electrode material layer and the second electrode material layer are spaced apart from each other, and
among the first protective material layer, the first electrode material layer, the second protective material layer, the second electrode material layer, and the third protective material layer, the first protective material layer is a lowermost layer, and the third protective material layer is an uppermost layer.

16. A semiconductor device comprising:

a conductive pattern; and a capacitor electrically connected to the conductive pattern, wherein the capacitor comprises:

a first electrode structure electrically connected to the conductive pattern;

a dielectric layer disposed on the first electrode structure;

a second electrode structure disposed on the dielectric layer; and a plate electrode disposed on the second electrode structure, wherein the second electrode structure comprises:

at least one electrode material layer; and at least one protective material layer, wherein a thickness of the at least one electrode material layer is greater than a thickness of the at least one protective material layer, wherein the at least one electrode material layer and the at least one protective material layer include a same metal element, wherein the at least one electrode material layer further includes a nitrogen element, and wherein the at least one protective material layer further includes a silicon element and an oxygen element.

17. The semiconductor device of claim 16, wherein the first electrode structure has a pillar shape extending in a direction, perpendicular to an upper surface of the conductive pattern, and the at least one electrode material layer does not include an oxygen element.

18. A semiconductor device comprising:

a conductive pattern; and a capacitor electrically connected to the conductive pattern, wherein the capacitor comprises:

a first electrode structure electrically connected to the conductive pattern;

a dielectric layer disposed on the first electrode structure;

a second electrode structure disposed on the dielectric layer; and a plate electrode disposed on the second electrode structure, wherein the second electrode structure comprises:

at least one electrode material layer; and at least one protective material layer, wherein the first electrode structure has a pillar shape extending in a direction, perpendicular to an upper surface of the conductive pattern, wherein the dielectric layer is disposed adjacent the first electrode structure, and between the first electrode structure and the second electrode structure, wherein a thickness of the at least one electrode material layer is greater than a thickness of the at least one protective material layer, wherein the at least one electrode material layer includes a first material, wherein the at least one protective material layer includes at least one of a second material and a third material, wherein the first material is a metal nitride including a metal element and a nitrogen element, wherein the second material includes a metal element, a silicon element, and an oxygen element, wherein the third material includes a metal element, a silicon element, an oxygen element, and a nitrogen element, and wherein the at least one electrode material layer is spaced apart from the dielectric layer by the at least one protective material layer.

19. The semiconductor device of claim 18, wherein the at least one protective material layer is part of a plurality of protective material layers, the plurality of protective material layers includes a first protective material layer and a second protective material layer spaced apart from each other, the first protective material layer is in contact with the dielectric layer, and the second protective material layer is in contact with the plate electrode.

20. The semiconductor device of claim 19, wherein the first material is a Titanium Nitride (TiN) material, the second material is Titanium Silicon Oxide (TiSiO) material, and the third material is a Titanium Oxynitride (TiSiON) material.

* * * * *